(12) United States Patent
Kwon et al.

(10) Patent No.: US 9,450,038 B2
(45) Date of Patent: Sep. 20, 2016

(54) FLEXIBLE DISPLAY

(71) Applicant: LG Display Co., Ltd., Seoul (KR)

(72) Inventors: SeYeoul Kwon, Goyang-si (KR);
HeeSeok Yang, Ansan-si (KR);
Sangcheon Youn, Seoul (KR);
SungWoo Kim, Paju-si (KR);
YoonDong Cho, Gwangmyeong-si (KR); Saemleenuri Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/449,112

(22) Filed: Jul. 31, 2014

(65) Prior Publication Data

US 2016/0035812 A1    Feb. 4, 2016

(51) Int. Cl.
| | | |
|---|---|---|
| *H01L 35/24* | (2006.01) | |
| *H01L 27/32* | (2006.01) | |
| *H01L 51/00* | (2006.01) | |
| *H01L 27/12* | (2006.01) | |
| *H01L 29/786* | (2006.01) | |
| *H01L 29/66* | (2006.01) | |
| *H01L 21/311* | (2006.01) | |

(52) U.S. Cl.
CPC ...... *H01L 27/3276* (2013.01); *H01L 21/31111* (2013.01); *H01L 27/1218* (2013.01); *H01L 27/1259* (2013.01); *H01L 27/3258* (2013.01); *H01L 29/66757* (2013.01); *H01L 29/7869* (2013.01); *H01L 29/78603* (2013.01); *H01L 29/78675* (2013.01); *H01L 51/0097* (2013.01); *H01L 27/323* (2013.01); *H01L 2251/5338* (2013.01)

(58) Field of Classification Search
CPC .......................... H01L 27/3244; H01L 51/56
USPC ........................................................ 257/40
See application file for complete search history.

(56) References Cited

U.S. PATENT DOCUMENTS

| | | | | |
|---|---|---|---|---|
| 2014/0097408 | A1* | 4/2014 | Kim | ........ H01L 27/3237 257/40 |
| 2014/0217373 | A1* | 8/2014 | Youn | ........ H01L 27/3276 257/40 |
| 2014/0231763 | A1* | 8/2014 | Kim | ........ H01L 27/3218 257/40 |

\* cited by examiner

*Primary Examiner* — Dung Le
(74) *Attorney, Agent, or Firm* — Fenwick & West LLP

(57) ABSTRACT

There is provided a flexible display having a plurality of innovations configured to allow bending of a portion or portions to reduce apparent border size and/or utilize the side surface of an assembled flexible display.

20 Claims, 16 Drawing Sheets

FLEXIBLE DISPLAY

BACKGROUND

1. Technical Field

This relates generally to electronic devices, and more particularly, to electronic devices with a display.

2. Description of the Related Art

Electronic devices often include displays. For example, cellular telephones and portable computers include displays for presenting information to a user. Components for the electronic device, including but not limited to a display, may be mounted in the housing made of plastic or metal.

An assembled display may include a display panel and a number of components for providing a variety of functionalities. For instance, one or more display driving circuits for controlling the display panel may be included in a display assembly. Examples of the driving circuits include gate drivers, emission (source) drivers, power (VDD) routing, electrostatic discharge (ESD) circuits, multiplex (mux) circuits, data signal lines, cathode contacts, and other functional elements. There may be a number of peripheral circuits included in the display assembly for providing various kinds of extra functions, such as touch sense or fingerprint identification functionalities.

Some of the components may be disposed on the display panel itself, often in the areas peripheral to the display area, which is referred in the present disclosure as the non-display area and/or the inactive area. When such components are provided in the display panel, they populate a significant portion of the display panel. Large inactive area tends to make the display panel bulky, making it difficult to incorporate it into the housing of electronic devices. Large inactive area may also require a significant portion of the display panel to be covered by overly large masking (e.g., bezel, borders, covering material), leading to unappealing device aesthetics.

Size and weight are of critical importance in designing modern electronic devices. Also, a high ratio of the active area size compared to that of inactive area, which is sometimes referred to as the screen to bezel ratio, is one of the most desired feature. There is a limit as to how much reduction in the size of the inactive area for higher screen-to-bezel ratio can be realized from mere use of a separate flexible printed circuit (FPC) for connecting components to the display panel. Space requirement for reliably attaching signal cables and to fan out wires along the edges of the display panel still needs to be disposed in the inactive area of the display panel.

It will be highly desirable to bend the base substrate where the active with the pixels and the inactive area are formed thereon. This would truly minimize the inactive area of the display panel that needs to be hidden under the masking or the device housing. Not only does the bending of the base substrate will minimize the inactive area size need to be hidden from view, but it will also open possibility to various new display device designs.

However, there are various new challenges that need to be solved in providing such flexible displays. The components formed directly on the base substrate along with the display pixels tend to have tremendously small dimension with unforgiving margin of errors. Further, these components need to be formed on extremely thin sheet to provide flexibility, making those components extremely fragile to various mechanical and environmental stresses instigated during the manufacture and/or in the use of the displays.

Further complication arises from the fact that the components fabricated directly on the base substrate with the display pixels are often closely linked to the operation of those pixels. If care is not taken, the mechanical stresses from bending of the flexible display can negatively affect the reliability or even result in complete component failure. Even a micro-scale defect in the component thereof can have devastating effects on the performance and/or reliability of the display pixels amounting to scrap the entire display panel without an option to repair.

For instance, a few micrometer scale cracks in the electric wires can cause various abnormal display issues and may even cause pixels in several rows or sections of the display panel not to be activated at all. As such, various special parameters must be taken in consideration when designing electrical wiring schemes to be fabricated on the flexible base substrate along with the display pixels. Simply increasing the bending radius may make it difficult to garner any significant benefits in flexing the base substrate of the display panel. It would therefore be desirable to provide a flexible display that can operate reliably even under the bending stresses from extreme bending radius.

BRIEF SUMMARY

An aspect of the present disclosure is related to a flexible display, which includes configurations for wire traces to withstand bending stress for reliable operation of the flexible display.

In an embodiment, a flexible display includes a base layer having a substantially flat portion and a bend portion. The bend portion is curved away from a plane of the substantially flat portion. The flexible display also includes a plurality of insulation layers on the base layer. With the plurality of insulation layers a high leveled surface and a low leveled surface is provided in the flexible display. A step is created between the high leveled surface and the low leveled surface. The flexible display further includes a conductive line trace laid over the high leveled surface and the low leveled surface, wherein the conductive line trace has a reinforced portion at the step.

In an embodiment, the width of the reinforced portion of the conductive line trace is greater than that of a portion of the conductive line trace adjacent to the reinforced portion.

In an embodiment, the step between the high leveled surface and the low leveled surface is provided within the substantially flat portion within an inactive area of the flexible display.

In an embodiment, the high leveled surface is positioned above a semiconductor layer of a thin-film-transistor (TFT) and the low leveled surface is positioned below the semiconductor layer of the TFT, wherein the conductive line trace is connected to the semiconductor layer via a contact hole through the high leveled surface.

In an embodiment, the flexible display further includes a metal layer that is positioned under a first insulation layer that provides the high leveled surface and a second insulation layer that provides the low leveled surface. The metal layer can be interposed between the first and second insulation layers and is electrically connected to the conductive line trace. The metal layer interposed between the first and second insulation layers can be connected to a source electrode of the TFT.

In another aspect, the present disclosure relates to a flexible display, which includes a substantially flat portion; a bend portion that is curved away from a tangent plane of the substantially flat portion; and a wire trace having at least three different trace designs, in which a first trace design is applied to a portion of the wire trace in the substantially flat portion, a second trace design is applied to a portion of the wire trace in the bend portion, and the third trace design is applied to a portion of the wire trace between the wire trace portions of the first trace design and of the second trace design.

In yet another aspect, the present disclosure relates to a method of manufacturing a flexible display. According to an embodiment, a buffer layer is formed on a base layer. Then, an active layer of a thin-film-transistor (TFT) is formed on the buffer layer. A gate insulation layer is formed on the active layer, and a gate electrode is formed on the gate insulation layer. On the gate electrode layer, an interlayer dielectric layer is formed. One or more of the interlayer dielectric layer, the gate insulation layer and a part of the buffer layer from a bend portion of the flexible display is etched, wherein a step is created between a high leveled surface and a low leveled surface. Then, one or more contact holes are formed to expose the active of the TFT. A wire trace is formed over the high leveled surface and the low leveled surface. Here, the portion of the wire trace extending over the step is provided with a wire trace block with a width, which is greater than a width of the adjacent portions of the wire trace and a length, which is equal to or greater than a length of the step.

DETAILED DESCRIPTION

Figure 1A:
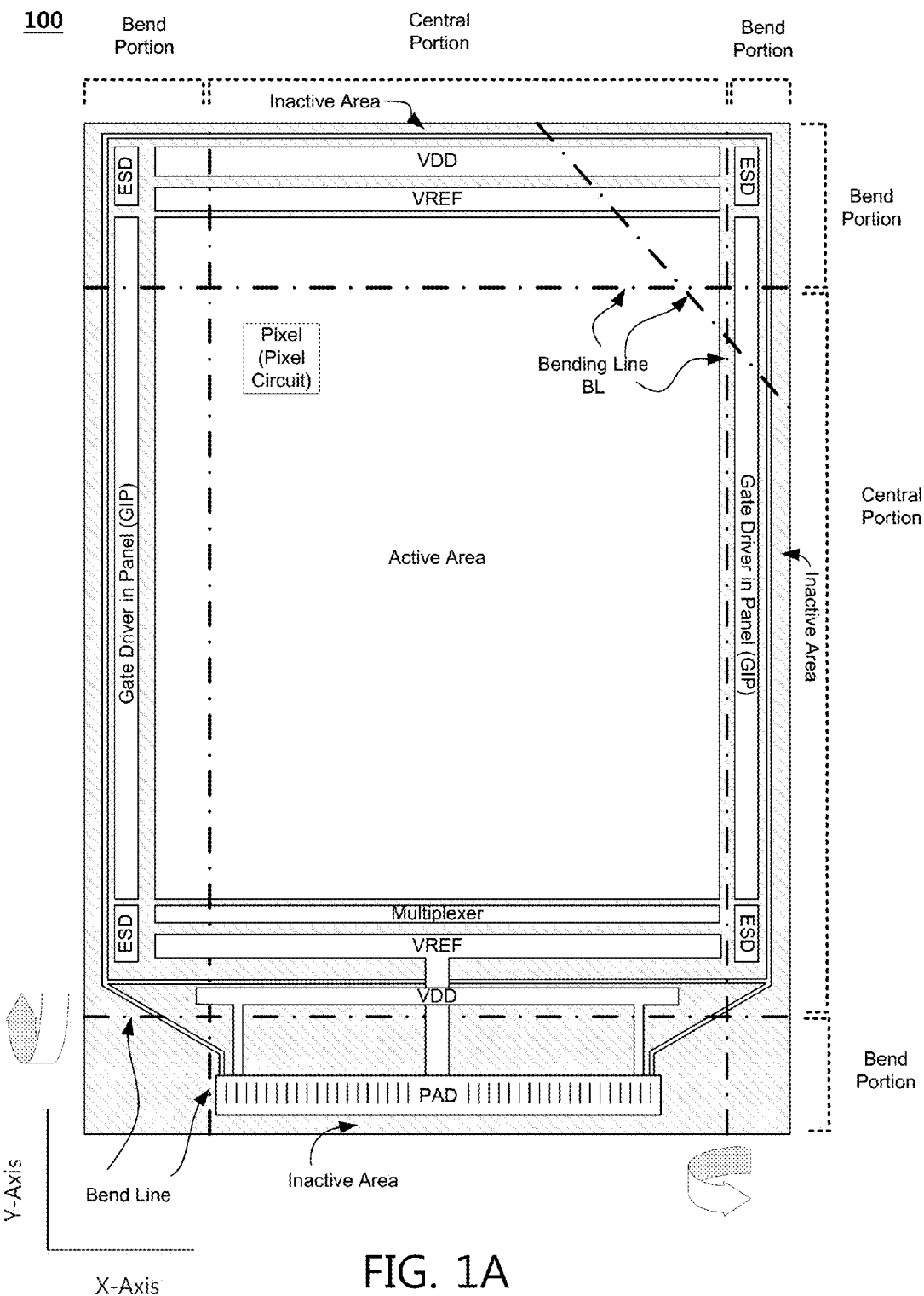
FIGS. 1A-1C illustrate schematic view of an exemplary flexible display device according to embodiments of the present disclosure.
Figure 1B:
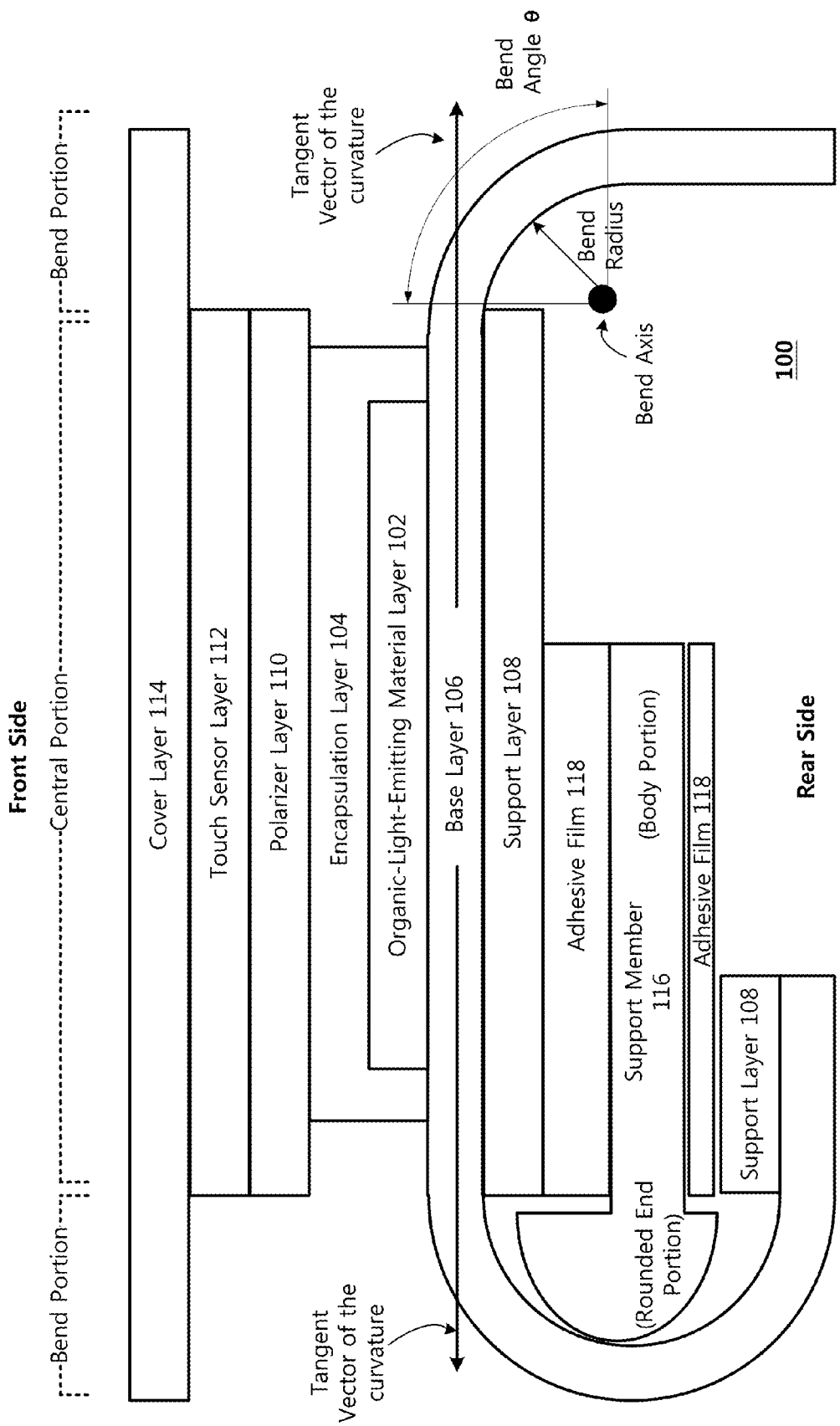
Figure 1C:
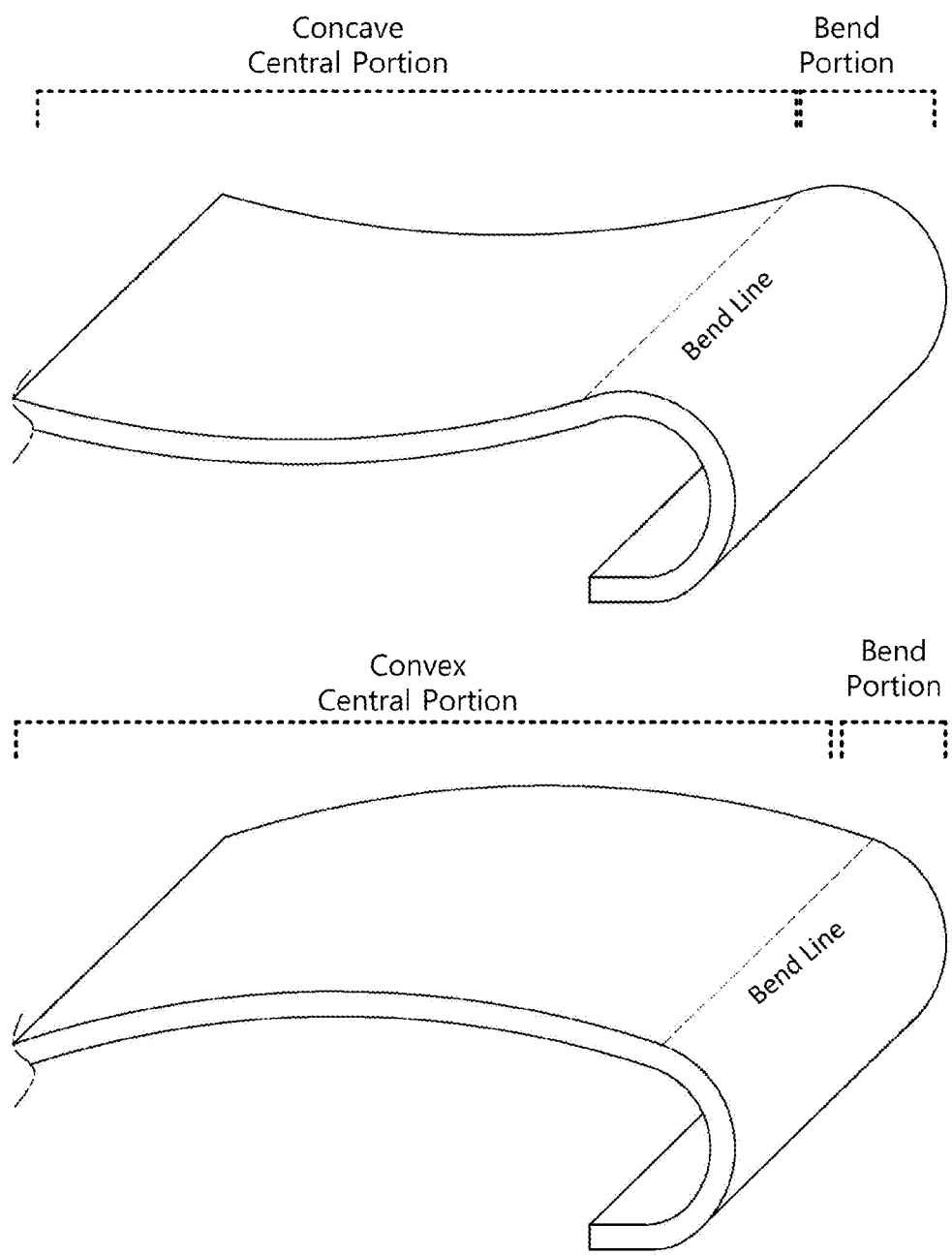

FIGS. 1A-1C illustrate exemplary flexible display 100 which may be incorporated in electronic devices. Referring to FIG. 1A, the flexible display 100 includes at least one active area (i.e., display area), in which an array of display pixels are formed therein. One or more inactive areas may be provided at the periphery of the active area. That is, the inactive area may be adjacent to one or more sides of the active area. In FIG. 1A, the inactive area surrounds a rectangular shape active area. However, it should be appreciated that the shapes of the active area and the arrangement of the inactive area adjacent to the active area are not particularly limited as the exemplary flexible display 100 illustrated in FIG. 1A. The active area and the inactive area may be in any shape suitable to the design of the electronic device employing the flexible display 100. Non-limiting examples of the active area shapes in the flexible display 100 include a pentagonal shape, a hexagonal shape, a circular shape, an oval shape, and more.

Parts of the flexible display 100 may be defined by a central portion and a bend portion. In reference to a bend line BL, the part of the flexible display 100 that remains substantially flat is referred to as the central portion or the substantially flat portion, and the other part of the flexible display 100 at the other side of the bend line BL is referred to as the bend portion. Within a bend portion, the part that has a curvature in an inclination angle or in a declination angle from the substantially flat portion may be specified as the bend allowance section of the bend portion.

Multiple portions of the flexible display 100 can be bent. Accordingly, one or more edges of the flexible display 100 can be bent away from the plane of the central portion along the several bend lines BL. The bend line BL may extend horizontally (e.g., X-axis shown in FIG. 1A), vertically (e.g., Y-axis shown in FIG. 1A) or even diagonally in the flexible display 100. While the bend line BL is depicted as being located near the edges of the flexible display 100, but it should be appreciated that the location the bend lines BL can be positioned in the mid-area of the central portion. Any one or more corners of the flexible display 100 may be bent as well. The flexible display 100 can be bent in any combination of horizontal, vertical and/or diagonal directions based on the desired design of the flexible display 100. The bend line BL may be placed across the central portion of the flexible display 100 to provide a foldable display or a double-sided display having display pixels on both outer sides of a folded display.

Each pixel in the active area may be associated with a pixel circuit, which includes at least one switching thin-film transistor (TFT) and at least one driving TFT. Each pixel circuit may be electrically connected to a gate line and a data line, and communicates with the driving circuits, such as a gate driver and a data driver, positioned in the inactive area of the flexible display 100 to operate the associated pixel.

The flexible display 100 may include various additional components for generating a variety of signals or otherwise operating the pixels in the active area. For example, an inverter circuit, a multiplexer, an electro static discharge (ESD) circuit and the like may be placed in the inactive area of the flexible display 100. The flexible display 100 may also include components associated with functionalities other than for operating the pixels of the flexible display 100. For instance, the flexible display 100 may include components for providing a touch sensing functionality, a user authentication functionality (e.g., finger print scan), a multi-level pressure sensing functionality, a tactile feedback functionality and/or various other functionalities for the electronic device employing the flexible display 100.

Some of the components may be mounted on a separate printed circuit and coupled to a connection interface (Pads/Bumps) disposed in the inactive area using a printed circuit film such as flexible printed circuit board (FPCB), chip-on-film (COF), tape-carrier-package (TCP) or any other suitable technologies. The inactive area with the connection interface can be bent away from the central portion so that the printed circuit film such as the COF, FPCB and the like are positioned at the rear side of the flexible display 100.

Some of the components may be positioned in the inactive area of the flexible display 100. For example, one or more driving circuits may be implemented with TFTs fabricated in the inactive area as depicted in FIG. 1A. Such gate drivers may be referred to as a gate-in-panel (GIP).

For convenience, the pixel circuit and the driving circuits in the embodiments of flexible display 100 will be described as being implemented with TFTs using low-temperature poly-silicon (LIPS) semiconductor layer as its active layer. Accordingly, in some embodiments, the pixel circuit and the driving circuits (e.g., gate driver) are implemented with NMOS LIPS TFTs having a co-planar structure. In some embodiments, the driving circuits in the inactive area of the flexible display 100 may be implemented with a combination of N-Type LIPS TFTs and P-Type LIPS TFTs.

It should be noted that some embodiments of the flexible display 100 can employ multiple types of TFTs to implement the driving circuits in the inactive area and/or the pixel circuits in the active. The type of TFTs may be selected according to the operating conditions and/or requirements of the TFTs in the corresponding circuit.

A low-temperature-poly-silicon (LIPS) TFT generally exhibits excellent carrier mobility even at a small profile, making it suitable for implementing condensed driving circuits. The excellent carrier mobility of the LIPS TFT makes it an ideal for components requiring a fast speed operation. Despite the aforementioned advantages, initial threshold voltages may vary among the LIPS TFTs due to the grain boundary of the poly-crystalized silicon semiconductor layer.

TFTs using other kinds of semiconductor layers may be different from the LIPS TFT in many respects. For instance, a TFT employing an oxide material based semiconductor layer such as an indium-gallium-zinc-oxide (IGZO) semiconductor layer, which is referred hereinafter as "the oxide TFT," is generally more advantageous than the LIPS TFT in terms of reducing the leakage current during operation of the display. In addition, the oxide TFT generally exhibits a higher voltage-holding ratio (VHR) than that of the LIPS TFT, albeit providing a lower mobility than the LIPS TFT. The higher VHR of the oxide TFT is more suitable for driving the pixels at a reduced frame rate when a high frame rate driving of the pixels is not needed. Accordingly, the pixel circuits may be implemented with the oxide TFTs in some embodiments of the flexible display 100 provided with a feature in which all or selective pixels are driven at a reduced frame rate (e.g., 30 frames per second) from a normal frame rate under a specific condition. Considering the benefits of the oxide TFTs mentioned above, a power efficient and energy saving flexible display 100 can be provided with the oxide TFT.

The oxide TFT does not suffer from the initial threshold voltage variation issue of the LIPS TFT, which can be a great advantage for a large sized flexible display 100. On the other hand, the LIPS TFT may fair better than the oxide TFT in terms of the positive bias temperature stress (PBTS) and the negative bias temperature stress (NBTS), which may cause unwanted threshold voltage shift during the use of the flexible display 100.

Considering the pros and cons of LIPS TFT and oxide TFT, some embodiments of the flexible display 100 disclosed herein may employ a combination of the LIPS TFT and the oxide TFT. In particular, some embodiments of the flexible display 100 can employ LIPS TFTs to implement the driving circuits (e.g., GIP) in the inactive area and employ oxide TFTs to implement the pixel circuits in the active area. Due to the excellent carrier mobility of the LIPS TFT, driving circuits implemented with LIPS TFTs may operate at a faster speed than the driving circuits implemented with the oxide TFTs. In addition, the LIPS TFT enables to provide more condensed driving circuits, which in turn, leading to a smaller sized inactive area in the flexible display 100. With excellent voltage holding ratio of the oxide TFTs used in the pixel circuits, the leakage current from the pixels can be reduced to lower the power consumption of the flexible display 100. This also enables to refresh pixels in a selective portion of the active area or to drive pixels at a reduced frame rate under a predetermined condition (e.g., when displaying still images) while minimizing possible display defects associated with the leakage current. In some embodiments, the driving circuits in the inactive area of the flexible display 100 may be implemented with a combination of N-Type LIPS TFTs and P-Type LIPS TFTs while the pixel circuits are implemented with oxide TFTs.

In some embodiments, the display driving circuits and/or peripheral circuits in the inactive area may be implemented by using both LIPS TFTs and oxide TFTs. Likewise, in some embodiments, the pixel circuits in the active area can be implemented by using both the LIPS TFTs and the oxide TFTs. For instance, the LIPS TFT can be used for TFTs of a driving circuit and/or in a pixel circuit, which are subjected to extended period of bias stress (e.g., PBTS, NBTS). In addition, the TFTs in a driving circuit and/or a pixel circuit, which are connected to a storage capacitor, can be formed of the oxide TFT to stably maintain the capacitance in the storage capacitor.

FIG. 1B is a simplified cross-sectional view of an exemplary flexible display. As illustrated in FIG. 1B, the central portion of the flexible display 100 may be substantially flat, and one or more bend portions may be bent away from the tangent vector of the curvature at a certain bend angle and a bend radius around the bending axis. The size of each bend portion that is bent away from the central portion needs not be the same. That is, the length of the base layer 106 from the bend line BL to the outer edge of the base layer 106 at each bend portion can be different. Also, the bend angle around the bend axis and the bend radius from the bend axis can vary between the bend portions.

In the example shown in FIG. 1B, one of the bend portion (right side) has the bend angle θ of 90°, and the bend portion includes a substantially flat section. The bend portion can be bent at a larger bend angle θ, such that at least some part of the bend portion comes underneath the plane of the central portion of the flexible display 100 as one of the bend portion (left side). Also, a bend portion can be bent at a bend angle θ that is less than 90°.

In some embodiments, the radius of curvatures (i.e., bend radius) for the bend portions in the flexible display 100 may be between about 0.1 mm to about 10 mm, more preferably between about 0.1 mm to about 5 mm, more preferably between about 0.1 mm to about 1 mm, more preferably between about 0.1 mm to about 0.5 mm. The lowest bend radius of the bend portion of the flexible display 100 may be less than 0.5 mm.

As shown in FIG. 1B, an organic light-emitting diode (OLED) element layer 102 is disposed on the base layer 106, and an encapsulation layer 104 is disposed on the organic light-emitting diode (OLED) element layer 102. The flexible display 100 also includes a support member 116, which may be referred to as a "mandrel." The support member 116 has a planar body portion and a rounded end portion. The base layer 106 and the support member 116 are arranged so that that the rounded end portion of the support member 116 is positioned in the bend portion of the base layer 106. In other words, the rounded end portion of the support member 116 facilitates to maintain the bend radius at the bend portion of the base layer 106. As shown in FIG. 1B, the bend portion of the base layer 106 may have a size that is sufficient to have a part of the base layer 106 come under the support member 116. In this way, the circuits mounted on the chip on flex (COF) cable and/or the printed circuit board can be placed at the backside of the flexible display 100.

The flexible display 100 includes one or more support layers 108 for providing rigidity at the selective portion of the flexible display 100. Accordingly, the support layer 108 should be more rigid than the base layer 106. The support layer 108 is attached on the inner surface of the base layer, which is the opposite side of the surface having the OLED element layer 102 disposed thereon. Increase in the rigidity at selective parts of the flexible display 100 may help in ensuring the accurate configuration and placement of the components of the flexible display 100.

The base layer 106 and the support layer 108 may each be made of a thin plastic film formed from polyimide, polyethylene naphthalate (PEN), polyethylene terephthalate (PET), other suitable polymers, a combination of these polymers, etc. Other suitable materials that may be used to form the base layer 106 and the support layer 108 include, metal foil covered with a dielectric material, a multi-layer polymer stack, a thin glass film bonded to a thin polymer, a polymer composite film comprising a polymer material combined with nanoparticles or micro-particles dispersed therein, etc.

Excessive thickness of the base layer 106 makes it harder to be bent at extremely small bending radius desired by the flexible display 100. Excessive thickness of the base layer 106 may also increase the mechanical stress to the components disposed thereon on the base layer 106. As such, the thickness of the base layer 106 may depend on the bend radius at the bend portion of the base layer 106. On the other hand, the base layer 106 with a thickness below a certain level may not be strong enough to reliably support various components disposed thereon.

Accordingly, the base layer 106 may have a thickness in a range of about from 5 μm to about 50 μm, more preferably in a range of about 5 μm to about 30 μm, and more preferably in a range of about 5 μm to about 16 μm. The support layer 108 may have a thickness from about 100 μm to about 125 μm, from about 50 μm to about 150 μm, from about 75 μm to 200 μm, less than 150 μm, or more than 100 μm. In one suitable exemplary configuration, the base layer 106 is formed from a layer of polyimide with a thickness of about 10 μm and the support layer 108 is formed from polyethylene terephthalate (PET) with a thickness of about 100 μm to about 125 μm.

During manufacturing or in normal use of the flexible display 100, part of the flexible display 100 may be exposed to external light. Some of the components or materials used in fabricating the components disposed on the base layer 106 may be sensitive to the external light, and undesirable state changes may occur upon exposure to the light of certain wavelength and/or exposure to the light amount of period. Some parts of the flexible display 100 may be more heavily exposed to the external light than others, and this can lead to a display non-uniformity (e.g., mura, shadow defects, etc.). To minimize such problems, the base layer 106 and/or the support layer 108 may include one or more materials capable of reducing the amount of external light passing through.

In way of an example, the light blocking material, for instance chloride modified carbon black, may be mixed in the constituent material of the base layer 106 (e.g., polyimide) so that the base layer 106 can provide a light blocking functionality. As such, the base layer 106 may be formed of polyimide with a shade. In addition to reducing undesired effects caused by the light coming in from the rear side of the flexible display 100, such a shaded base layer 106 can improve the visibility of the displayed image content by reducing the reflection of the external light coming in from the front side of the flexible display 100. Instead of the base layer 106, the support layer 108 may include a light blocking material to reduce the amount of light coming in from the rear side (i.e., the support layer 108 attached side) of the flexible display 100. The constituent material of the support layer 108 may be mixed with one or more light blocking materials in the similar fashion as described above with the base layer 106.

In some embodiments, both the base layer 106 and the support layer 108 can include one or more light blocking materials. Here, the light blocking materials used in the base layer 106 and the support layer 108 need not be the same.

While making the base layer 106 and the support layer 108 to block the unwanted external light may improve display uniformity and reduce reflection as described above, it can create a number of difficulties during manufacturing of the flexible display 100. When the base layer 106 and the support layer 108 are non-transmittable to an excessive range of wavelengths of light, recognizing the alignment marks on these layers during their alignment process may not be easy. In particular, accurate positioning of the components on the base layer 106 or the alignment during bending of the flexible display 100 can become difficult, as the positioning of the layers may need to be determined by comparing the outer edges of the overlapping portions of the layer(s). Further, checking for unwanted debris or other foreign materials in the flexible display 100 can be problematic if the base layer 106 and/or the support layer 108 blocks the excessive range(s) of light spectrum (i.e., wavelengths in the visible, the ultraviolet and the infrared spectrum).

Accordingly, in some embodiments, the light blocking material, which may be included in the base layer 106 and/or the support layer 108 is configured to pass the light of certain polarization and/or the light within specific wavelength ranges usable in one or more manufacturing and/or testing processes of the flexible display 100. In way of an example, the support layer 108 may pass the light used in the quality check, alignment processes (e.g., UV, IR spectrum light) during the manufacturing the flexible display 100 but filter the light in the visible light wavelength range. The limited range of wavelengths can help reduce the display non-uniformity problem, which may be caused by the shadows generated by the printed circuit film attached to base layer 106, especially if the base layer 106 includes the light blocking material as described above.

It should be noted that the base layer 106 and the support layer 108 can work together in blocking and passing specific types of light. For instance, the support layer 108 can change the polarization of light, such that the light will not be passable through the base layer 106. This way, certain type of light can penetrate through the support layer 108 for various purposes during manufacturing of the flexible display 100, but unable to penetrate through the base layer 106 to cause undesired effects to the components disposed on the opposite side of the base layer 106.

The flexible display 100 may also include a polarizer layer 110 for controlling the display characteristics (e.g., external light reflection, color accuracy, luminance, etc.) of the flexible display 100. A cover layer 114 may be used to protect the flexible display 100. Electrodes for sensing touch input from a user may be formed on an interior surface of a cover layer 114 and/or at least one surface of the polarizer layer 110.

The flexible display 100 may further include a separate layer that includes the touch sensor electrodes and/or other components associated with sensing of touch input (referred hereinafter as touch-sensor layer 112). The touch sensor electrodes (e.g., touch driving/sensing electrodes) may be formed from transparent conductive material such as indium tin oxide, carbon based materials like graphene or carbon nanotube, a conductive polymer, a hybrid material made of mixture of various conductive and non-conductive materials. Also, metal mesh (e.g., aluminum mesh, silver mesh, etc.) can also be used as the touch sensor electrodes.

The touch sensor layer 112 may include a layer formed of one or more deformable materials. One or more electrodes may be interfaced with or positioned near the deformable material, and loaded with one or more signals to facilitate measuring electrical changes on one or more of the electrodes upon deformation of the deformable material. The measurement may be analyzed to assess the amount of pressure at a plurality of discrete levels and/or ranges of levels on the flexible display 100. In some embodiments, the touch sensor electrodes can be utilized in identifying the location of the user inputs as well as assessing the pressure of the user input. Identifying the location of touch input and measuring of the pressure of the touch input on the flexible display 100 may be achieved by utilizing at least one common signal. Also, measuring the amount of pressure may utilize at least one electrode other than the touch sensor electrodes to measure at least one other signal, which may be obtained simultaneously with the touch signal from the touch sensor electrodes or obtained at a different timing.

In some embodiments, the deformable material may be electro-active materials, which the amplitude and/or the frequency of the deformation is controlled by an electrical signal and/or electrical field. The examples of such deformable materials include piezo ceramic, electro-active-polymer (EAP) and the like. Accordingly, the touch sensor electrodes and/or separately provided electrode can activate the deformable material to bend the flexible display 100 to desired directions. In addition, such electro-active materials can be activated to vibrate at desired frequencies, thereby providing tactile and/or texture feedback on the flexible display 100. It should be appreciated that the flexible display 100 may employ a plurality of electro-active material layers so that bending and vibration of the flexible display 100 can be provided simultaneously or at a different timing. Such a combination can be used in providing sound directly from the flexible display 100 without a separate speaker.

As mentioned above, bending the inactive area allows to minimize or to eliminate the inactive area seen from the front side of the assembled flexible display 100. If the bend portion does not cover the entire inactive area on the side of the flexible display 100, the inactive area that remains visible from the front side can be covered with a bezel. The bezel may be formed, for example, from a stand-alone bezel structure that is mounted to a housing of the electronic device, from a portion of housing (e.g., a portion of the sidewalls of housing), or using other suitable structures. The inactive area remaining visible from the front side may also be hidden under an opaque masking layer, such as black ink (e.g., a polymer filled with carbon black) or a layer of opaque metal. Such an opaque masking layer may be coated on a portion of layers included in the flexible display 100, such as the touch sensor layer 112, the polarizer layer 110, the cover layer 114, and other suitable layers.

While the central portion of the flexible display 100 has a flat surface in FIG. 1B, some embodiments may not have such a flat central portion. The central portion of the flexible display 100 can be curved-in or curved-out as depicted in FIG. 1C, providing flexible display 100 with a concave or a convex central portion. Even in the embodiments with a convex or concave curved central portion, one or more bend portions of the flexible display 100 can be bent inwardly or outwardly along the bend line at a bend angle around a bend axis.

Figure 2A:
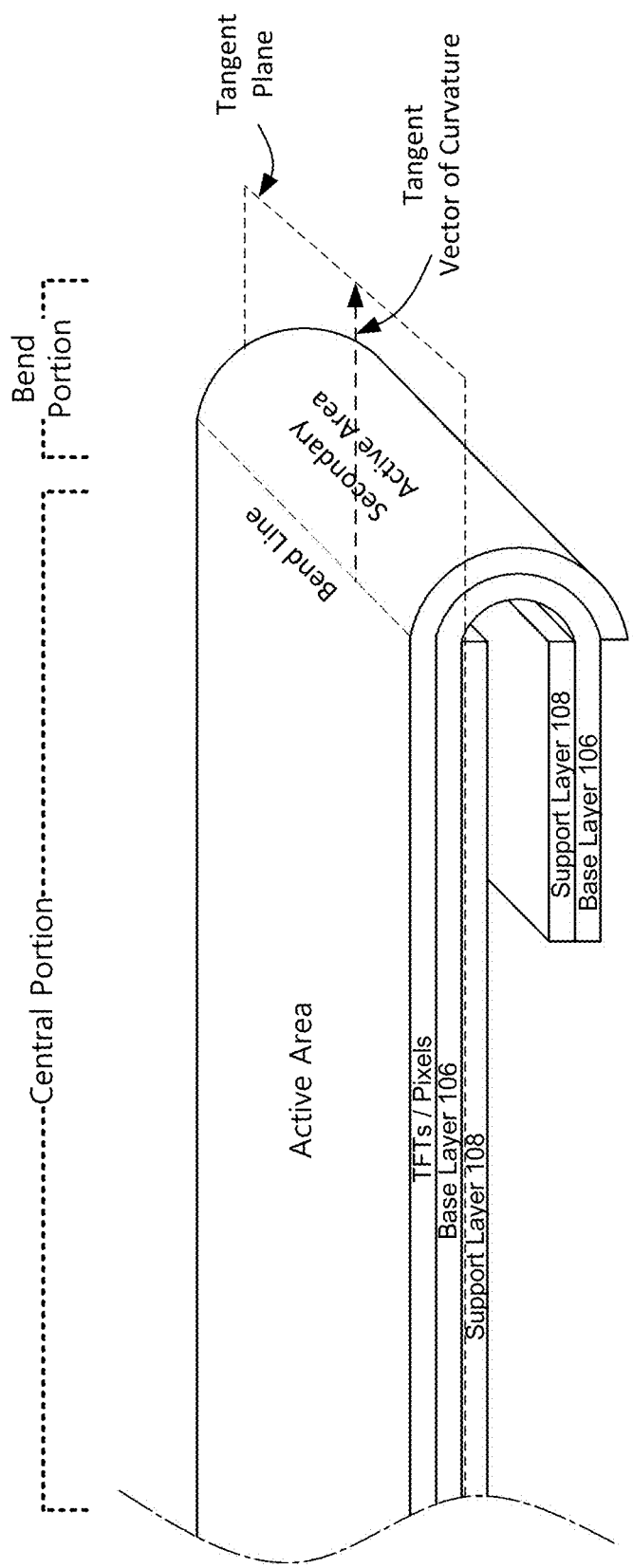
FIGS. 2A-2B illustrate schematic view of an exemplary flexible display device according to embodiments of the present disclosure.
Figure 2B:
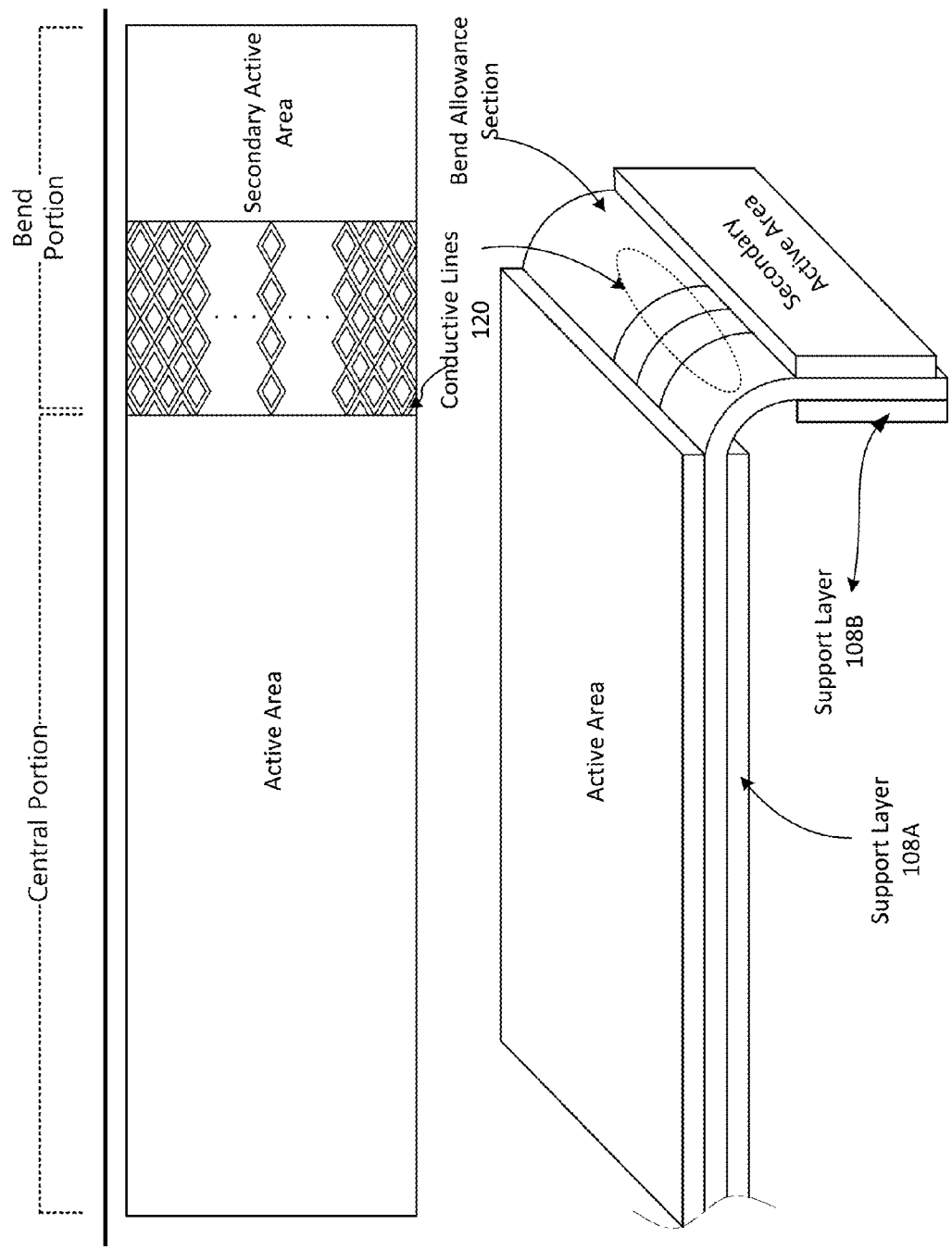

Referring back to FIG. 1A, the bend portion of the flexible display 100 may include an active area capable of displaying image from the bend portion, which is referred herein after as the secondary active area. That is, the bend line BL can be positioned in the active area so that at least some display pixels of the active area is included in the bend portion of the flexible display 100. In this case, the matrix of pixels in the secondary active area of the bend portion may be continuously extended from the matrix of the pixels in the active area of the central portion as depicted in FIG. 2A. Alternatively, the secondary active area within the bend portion and the active area within the central portion of the flexible display 100 may be separated apart from each other by the outer bend radius as depicted in FIG. 2B.

The secondary active area in the bend portion may serve as a secondary display area in the flexible display 100. The size of the secondary active area is not particularly limited. The size of the secondary active area may depend on its functionality within the electronic device. For instance, the secondary active area may be used to provide images and/or texts such a graphical user interface, buttons, text messages, and the like. In some cases, the secondary active area may be used to provide light of various colors for various purposes (e.g., status indication light), and thus, the size of the secondary active area need not be as large as the active area in the central portion of the flexible display 100.

The pixels in the secondary active area and the pixels in the central active area may be addressed by the driving circuits (e.g., gate driver, data driver, etc.) as if they are in a single matrix. In this case, the pixels of the central active area and the pixels of the secondary active area may be operated by the same set of signal lines (e.g., gate lines, emission lines, etc.). In way of example, the Nth row pixels of the central active area and the Nth row pixels of the secondary active area may be configured to receive the gate signal from the same gate driver. As shown in FIG. 2B, the part of the gate line crossing over the bend allowance section (i.e., bend allowance region) or a bridge for connecting the gate lines of the two active areas may have a split trace design made of at least two sub-traces, which will be described in further detail below.

In some embodiments, the pixels in the secondary active area may be driven discretely from the pixels in the central active area. That is, the pixels of the secondary active area may be recognized by the display driving circuits as being an independent matrix of pixels separate from the matrix of pixels in the central active area. In such cases, the pixels of the central active area and the pixels of the secondary active area may utilize different set of signal lines from each other. Further, the secondary active area may be employ one or more display driving circuits discrete from the ones employed by the central active area.

Components of the flexible display 100 may make it difficult to bend the flexible display 100 along the bend line BL. Some of the elements, such as the support layer 108, the touch sensor layer 112, the polarizer layer 110 and the like, may add too much rigidity to the flexible display 100. Also, the thickness of such elements can make other elements of the flexible display 100 subjected to greater bending stresses as well.

To facilitate easier bending and to enhance the reliability of the flexible display 100, the configuration of components in one portion of the flexible display 100 may differ from other portion of the flexible display 100. In other words, some of the components may not be disposed on one or more portions of the flexible display 100, or may have different thicknesses at different portions of the flexible display 100. Accordingly, the bend portion may free of the support layer 108, the polarizer layer 110, the touch sensor layer 114, a color filter layer and/or other components that may hinder bending of the flexible display 100. Such components may not be needed in the bend portion if the bend portion is to be hidden from the view or otherwise inaccessible to the users of the flexible display 100.

Even if the secondary active area is in the bend portion for providing information to users, the secondary active area may not require some of these components depending on the usage and/or the type of information provided by the secondary active area. For example, the polarizer layer 110 and/or color filter layer may not be needed in the bend portion when the secondary active area is used for simply emitting colored light, displaying texts or simple graphical user interfaces in a contrast color combination (e.g., black colored texts or icons in white background). Also, the bend portion of the flexible display 100 may be free of the touch sensor layer 114 if such functionality is not needed in the bend portion. If desired, the bend portion may be provided with a touch sensor layer 112 and/or the layer of electro-active material even though the secondary active area for displaying information is not provided in the bend portion.

Also, some of the components typically placed in the central portion may be separated from the respective components in the bend portion to reduce unwanted cracks or damages due to the bend stress. To this end, some of the elements in the central portion may not be formed in at least some part of the bend portion. The separation between the components in the central portion and the bend portion may be created by selectively removing the elements at the bend allowance section of the flexible display 100 such that the bend allowance section is free of the respective elements.

In some embodiments, at least part of the bend allowance section in the flexible display 100 can be free of the support layer 108, thereby separating the support layer 108A in the central portion and the support layer 108B in the bend portion underside of the base layer 106 as illustrated in FIG. 2B. Components and/or layers disposed on the base layer 106, for example the polarizer layer 110 and the touch sensor layer 114, in the central portion and the bend portion may also be separated by a part or by the entire length of the bend allowance section of the flexible display 100. Some components in the central portion may be electrically connected to the components in the bend portion via one or more conductive line trace 120 laid across the bend allowance section of the flexible display 100.

The removal of the elements may be done by cutting, wet etching, dry etching, scribing and breaking, or other suitable material removal methods. Rather than cutting or otherwise removing an element, separate pieces of the element may be formed at the central portion and the bend portion to leave the bend allowance section free of such element.

Figure 3:
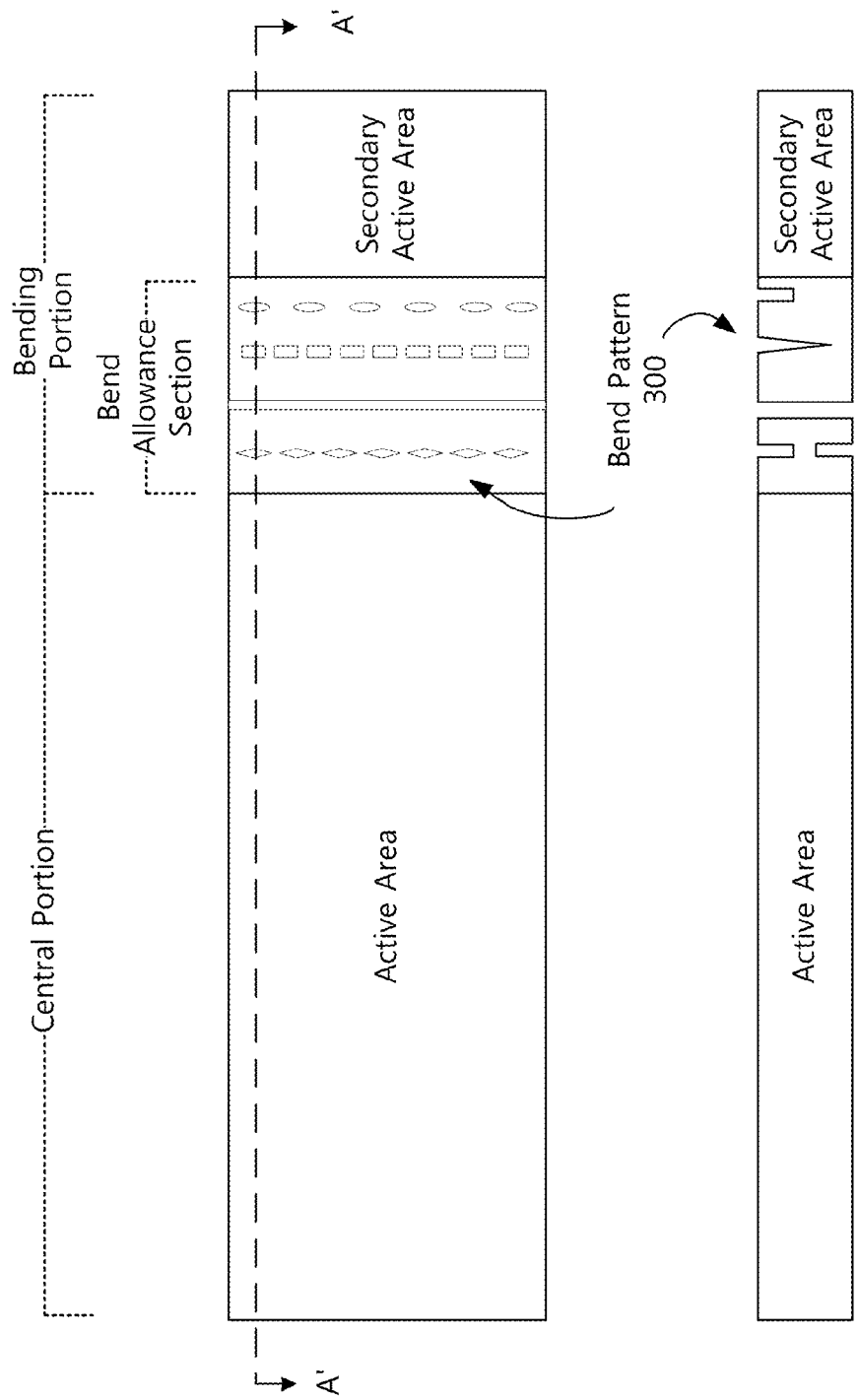
FIG. 3 illustrates schematic plane view and corresponding cross-sectional view of bending pattern, which may be employed in embodiments of the present disclosure.

In order to reduce the bend stress, some elements may be provided with a bend pattern along the bend lines or otherwise within the bend allowance section rather than being entirely removed from the bend portion. FIG. 3 illustrates a plane view and a cross-sectional view of exemplary bend patterns 300. It should be noted that the flexible display 100 may utilize more than one type of bend patterns. If desired, the depth of the patterns may not be deep enough to penetrate through the component entirely but penetrate only partially through the respective layer. It should be noted that the order of the bend patterns illustrated in the plane view of the flexible display 100 does not necessarily match with the order of bend patterns illustrated in the cross sectional view of the flexible display 100 in FIG. 3. The bend patterns 300 described above may be used in the support layer 108, the polarizer layer 110, the touch sensor layer 114 and various other elements of the flexible display 100. In addition, a buffer layer positioned between the base layer 106 and the TFT as well as a passivation layer covering a conductive line trace may be also be provided with the bend pattern for reducing bend stress. It should be appreciated that a number of bend patterns and the types of the bend patterns 300 utilized by the components are not limited. Accordingly, an element may utilize several types of bend patterns 300.

Several conductive lines are included in the flexible display 100 for electrical interconnections between various components therein. The circuits fabricated in the active area and inactive area may transmit various signals via one or more conductive lines to provide a number of functionalities in the flexible display 100. As briefly discussed, some conductive lines may be used to provide interconnections between the circuits and/or other components in the central portion and the bend portion of the flexible display 100.

In the present disclosure, the conductive lines may include source/drain electrodes of the TFTs as well as the gate lines/data lines used in transmitting signals from some of the display driving circuits (e.g., gate driver, data driver) in the inactive area to the pixel circuits in the active area. Likewise, some conductive lines, such as the touch sensor electrodes, pressure sensor electrodes and/or fingerprint sensor electrodes may provide signals for sensing touch input or recognizing fingerprints on the flexible display 100. The conductive lines can also provide interconnections between the pixels of the active area in the central portion and the pixels of the secondary active area in the bend portion of the flexible display 100. Aforementioned uses of conductive lines are merely illustrative. As used herein, the conductive lines broadly refers to a conductive path for transmitting any type of electrical signals, power and/or voltages from one point to another point in the flexible display 100.

Some of the conductive lines may be extended from the substantially flat portion of the flexible display to the bend portion of the flexible display 100. In such cases, some portions of the conductive lines may be configured differently from the other portions to withstand the bending stress. In particular, the portion of the conductive lines laid over the bend allowance section of the flexible display 100 may include several features for reducing cracks and fractures of the conductive lines to maintain proper interconnection.

Figure 4A:
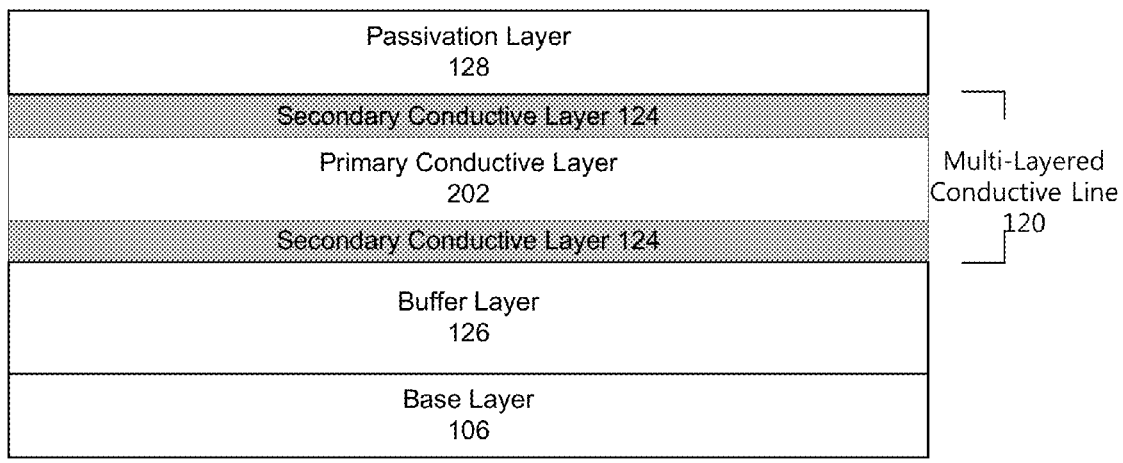
FIGS. 4A-4B illustrate schematic view of an exemplary multi-layered conductive lines usable in a flexible display device according to embodiments of the present disclosure.
Figure 4B:
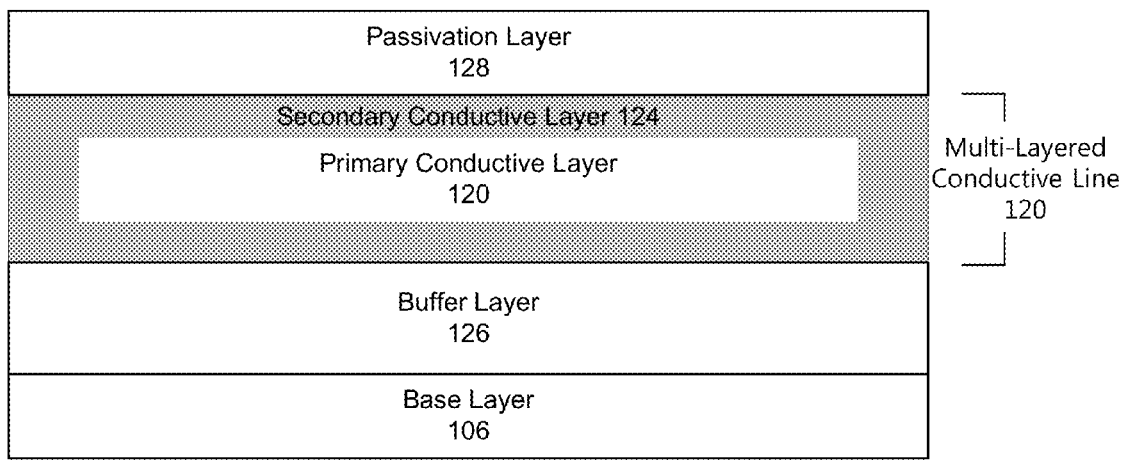

Some of the conductive lines in the flexible display 100 may have a multi-layered structure, which may allow more stretching (or flexibility) with less chance of breakage. FIGS. 4A and 4B each illustrates exemplary stack structure of the conductive line 120. In FIG. 4A, the conductive line 120 may have a multi-layered structure in which the primary conductive layer 122 is sandwiched between the secondary conductive layers 124.

The primary conductive layer 122 may be formed of material with a lower electrical resistance than that of the secondary conductive layer 144. Non-limiting examples of the materials for the primary conductive layer 122 includes copper, aluminum, transparent conductive oxide, or other flexible conductors. The secondary conductive layer 124 should be formed of conductive material that can exhibit sufficiently low ohmic contact resistance when formed in a stack over the primary conductive layer 122.

Examples of such combination include an aluminum layer sandwiched between titanium layers (Ti/Al/Ti), an aluminum layer sandwiched between upper and lower molybdenum layers (Mo/Al/Mo), a copper layer sandwiched between titanium layers (Ti/Co/Ti) and a copper layer sandwiched between upper and lower molybdenum layers (Mo/Co/Mo). However, the low ohmic contact resistance of the conductive layer stack is not the only factor for choosing the materials for the conductive line 120 used in the flexible display 100.

With extreme bend radius requirement at the bend allowance section of the flexible display 100, the materials for forming the conductive line trace 120 should meet the minimum Young's modulus requirement while meeting the stringent electrical requirements of the flexible display 100. Accordingly, both the primary conductive layer 122 and the secondary conductive layer 124 should be formed of materials exhibiting low brittleness (E). In this regard, Al has a modulus of about 71 GPa, Ti has a modulus of 116 GPa, and Mo has a modulus of 329 GPa. As such, the brittleness (E) of Al is about ¼ of that of Mo, and the brittleness (E) of Ti is about ⅓ of that of Mo. Accordingly, in some embodiments, at least some of the conductive lines 120 of the flexible display 100 are formed of a stack including Al and TI. Unlike Mo, both Al and Ti exhibited no cracks at the bend radius of 0.5 mm.

Since the primary conductive layer 122 should have lower electrical resistance than the secondary conductive layer 124, the conductive line 120 may be formed in a stack of Ti/Al/Ti. In particular, at least some of the conductive lines 120 disposed in the bend allowance section may be formed in a stack of Ti/Al/Ti.

In some embodiments, the flexible display 100 may be employed in a wearable electronic device. In such cases, the flexible display 100 may be operating under highly humid environment. In some cases, sweat of the user may penetrate in the device housing, and corrode some of the conductive line trace 120. Dissimilar metals and alloys have different electrode potentials, and when two or more come into contact in an electrolyte, one metal acts as anode and the other as cathode. The electro-potential difference between the dissimilar metals is the driving force for an accelerated attack on the anode member of the galvanic couple, which is the primary conductive layer 202 in the Ti/Al/Ti stack. The anode metal dissolves into the electrolyte, and deposit collects on the cathodic metal. Due to Al wire corrosion, electrical characteristics of the conductive line trace 120 may be deteriorated (withstand voltage may be lowered, etc.), and wire breakage may even occur.

Typically, galvanic corrosion is initiated by the electrolyte that is in contact at the cross-sectional side of a stack structured wire. Accordingly, at least some conductive lines 120 of an embodiments may have a structure in which the primary conductive layer 122 is surrounded by the secondary conductive layer 124 such that even the two side ends of the primary conductive layer 122 are covered by the secondary conductive layer 124 as shown in FIG. 4B. This can minimize the loss of primary conductive layer 202 by galvanic corrosion, and further reduce probability of severance of electrical conductivity.

Such multi-layered conductive lines 120 can be created by first depositing the material for the primary conductive layer 122 (e.g., Al) over the secondary conductive layer 124 (e.g., Ti). Here, the secondary conductive layer 124 underneath the primary conductive layer 122 may have greater width. Etch resist material is formed over the stack of these two layers and etched (e.g., dry etch, wet etch, etc.) to form a desired a conductive line trace (e.g., diamond trace design). After striping the etch resistance material, another layer of secondary conductive layer 124 (i.e., Ti) is deposited over the patterned structure (i.e., Ti/Al). Again, the secondary conductive layer 124 on top of the primary conductive layer 122 may have greater width such that the primary conductive layer 122 is enclosed within the secondary conductive layer 124. Another round of dry etching and striping of the etch resistance material is performed to form the stack of the multi-layered structure (i.e., Ti/Al/Ti) in a desired conductive line trace design.

Various insulation layers, such as the a buffer layer 126, the passivation layer 128, a gate insulation layer (GI layer) and an interlayer dielectric layer (ILD layer) may be formed at the lower and/or upper side of the conductive line trace 120. These insulation layers may be formed of organic and/or inorganic materials or include a sub-layer formed of inorganic materials, which are generally less ductile than the metals of the conductive lines 120.

Given the same amount of bending stress, cracks generally initiate from the insulation layers for the conductive line trace 120. Even if the conductive lines trace 120 has sufficient modulus to withstand the bending stress without a crack, the cracks initiated from the insulation layer tend to grow and propagate into the conductive lines 120, creating spots of poor electrical contacts that could render the flexible display 100 unusable. Accordingly, various bending stress reduction techniques are utilized in both the insulation layers and the conductive lines 120.

It should be noted that cracks primarily propagate through inorganic insulation layers. Accordingly, propagation of cracks can be suppressed by selectively removing inorganic insulation layers from the areas prone to cracks. Accordingly, the inorganic insulation layers and/or stack of insulation layers including an inorganic insulation layer can be selectively etched away at certain part of the flexible display 100.

Figure 5A:
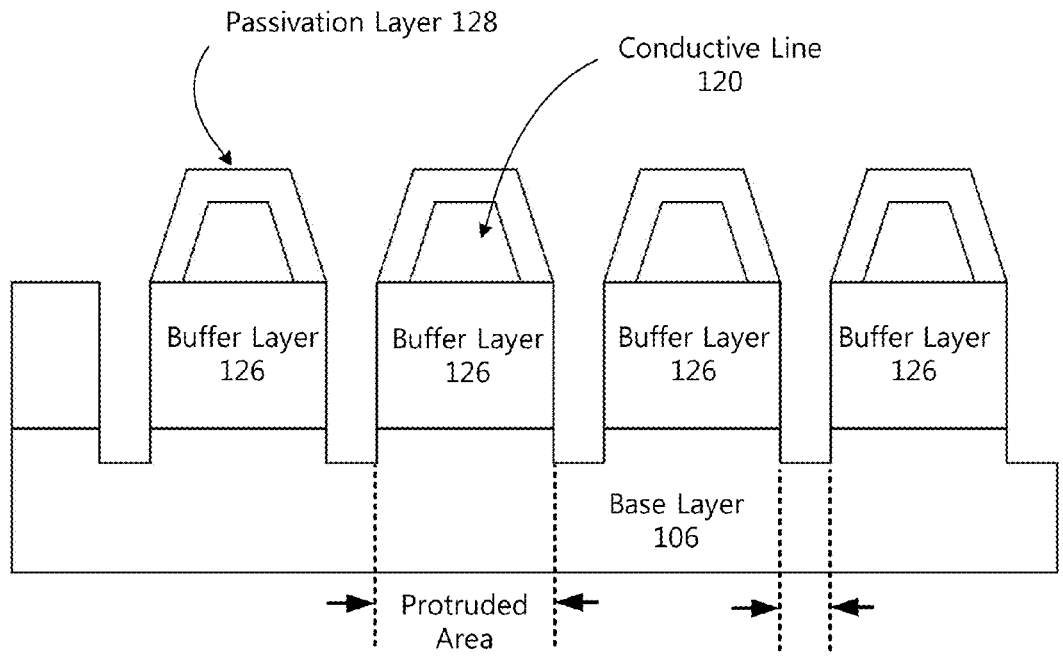
FIGS. 5A-5B illustrate schematic view of an exemplary configuration of multi-layered conductive lines and insulation layers according to embodiments of the present disclosure.

For example, the insulation layer under the conductive line trace 120 can be etched away as depicted in FIG. 5A. The insulation layer under the conductive line 120 may be the buffer layer 126, which may include one or more layers of inorganic material layers.

The buffer layer 126 is disposed on the base layer 126, but under the TFT. Also, the buffer layer 126 is formed of one or more layers of a SiNx layer and a $SiO_2$ layer. The buffer layer 126 formed on the substantially flat portion of the base layer 106 may be thicker than the buffer layer 126 over the bend portion of the base layer 106. To facilitate easier bending of the flexible display 100, a part of the buffer layer 126 may etched away in the bend portion of the flexible display 100. For example, the buffer layer 126 in the substantially flat portion may include multiple stacks of a SiNx layer and a $SiO_2$ layer, and the buffer layer 126 in the bend portion includes a single stack of a SiNx layer and a SiO₂ layer. As such, the buffer layer 126 in the substantially flat portion of the flexible display 100 has at least one additional sub-layer than the buffer layer in the bend portion of the flexible display 100.

Each layer of a SiNx layer and a SiO₂ layer may have a thickness of about 1000 Å. As such the thickness of the buffer layer in the bend portion of the flexible display may range from about 100 Å to about 2000 Å. In the substantially flat portion of the flexible display 100, the upper most inorganic layer, which is the inorganic layer immediately below the semiconductor layer of the TFT, has a thickness of about 3000 Å.

In the bend allowance section, the buffer layer 126 may be etched even further to expose the base layer 106 while leaving the buffer layer 126 intact under the conductive line trace 120. In other words, a recessed area and a protruded area are provided in the bend portion of the flexible display 100. The protruded area includes the buffer layer 126 provided on the base layer 106, whereas the recessed area has the base layer 106 exposed without the buffer layer 126 disposed thereon. The conductive line trace 120 is positioned on the protruded area, and the passivation layer 128 is positioned over the conductive line trace 120 on the protruded area. Although the passivation layer 128 may be temporarily deposited over the recessed area, the passivation layer 128 can be removed from the recessed area by dry etch or wet etch process. As such, the recessed area can be substantially free of the passivation layer 128. When etching the passivation layer 128 from the recessed area, part of the base layer 106 can also be etched. Accordingly, the thickness of the base layer 106 at the recessed area can be lower than that of the base layer 106 elsewhere in the flexible display 100. When the buffer layer 126 is etched away as shown in FIG. 5A, the crack propagation within the multi-buffer 126, which may propagate into the conductive line trace 120 can be prevented.

Figure 5B:
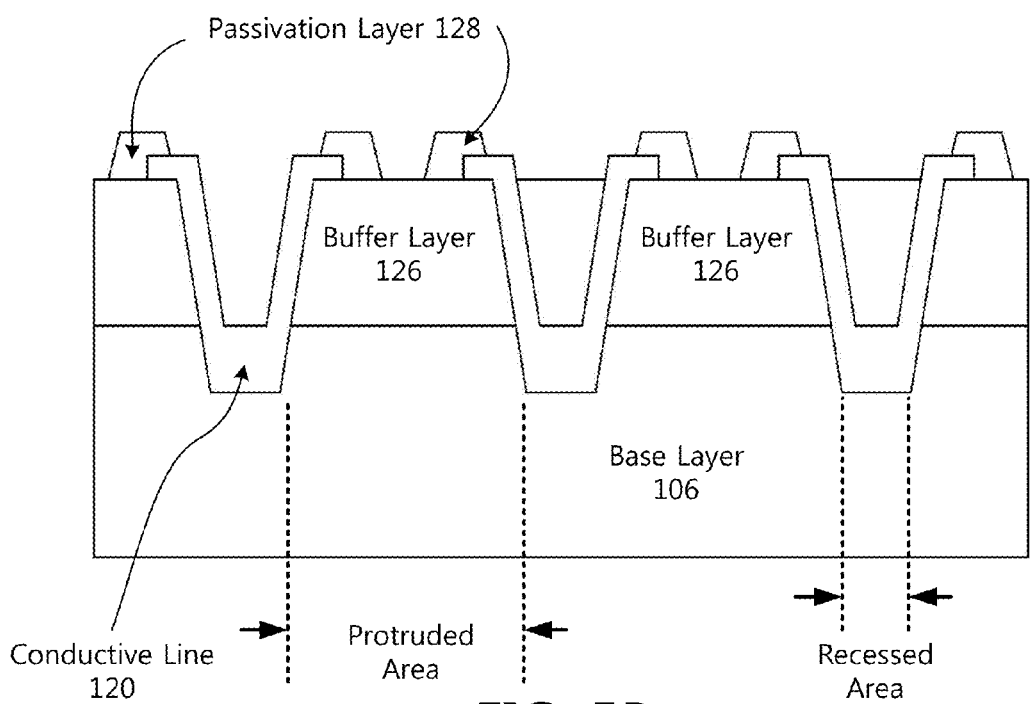

As illustrated in FIG. 5B, in some embodiments, the recessed area includes the base layer 106 that is etched to a certain depth, and the conductive line trace 120 is deposited on the base layer 106 of the recessed area. In this setting, the portion of the conductive line trace 120 is disposed within the base layer 106. The conductive line trace 120 is also deposited on a part of the buffer layer 126 that provides the protruded area. A passivation layer 128 can be deposited over the conductive line trace 120, and then the passivation layer 128 is etched away from the recessed area to expose the conductive line 120 in the recessed area. Accordingly, the passivation layer 128 remains on the conductive line trace 120 positioned on the protruded area. In this configuration, the passivation layer 128 remaining on the buffer layer 126 inhibits galvanic corrosion as it covers the side surface of the multi-layered conductive line trace 120. Accordingly, the conductive line trace 120 in the recessed area needs not be covered by the passivation layer 128. With the passivation layer 128 removed from the surface of the conductive line trace 120, crack propagation from the passivation layer 128 can be prevented. Since galvanic corrosion starts from the edge of the conductive line trace 120 on the buffer layer, the passivation layer 128 covering the edge of the conductive lines 120 on the buffer 126 may not be needed if the distance between the conductive line trace 120 on the buffer layer 126 and the conductive line trace 120 in the base layer 106 is sufficiently far.

Figure 6A:
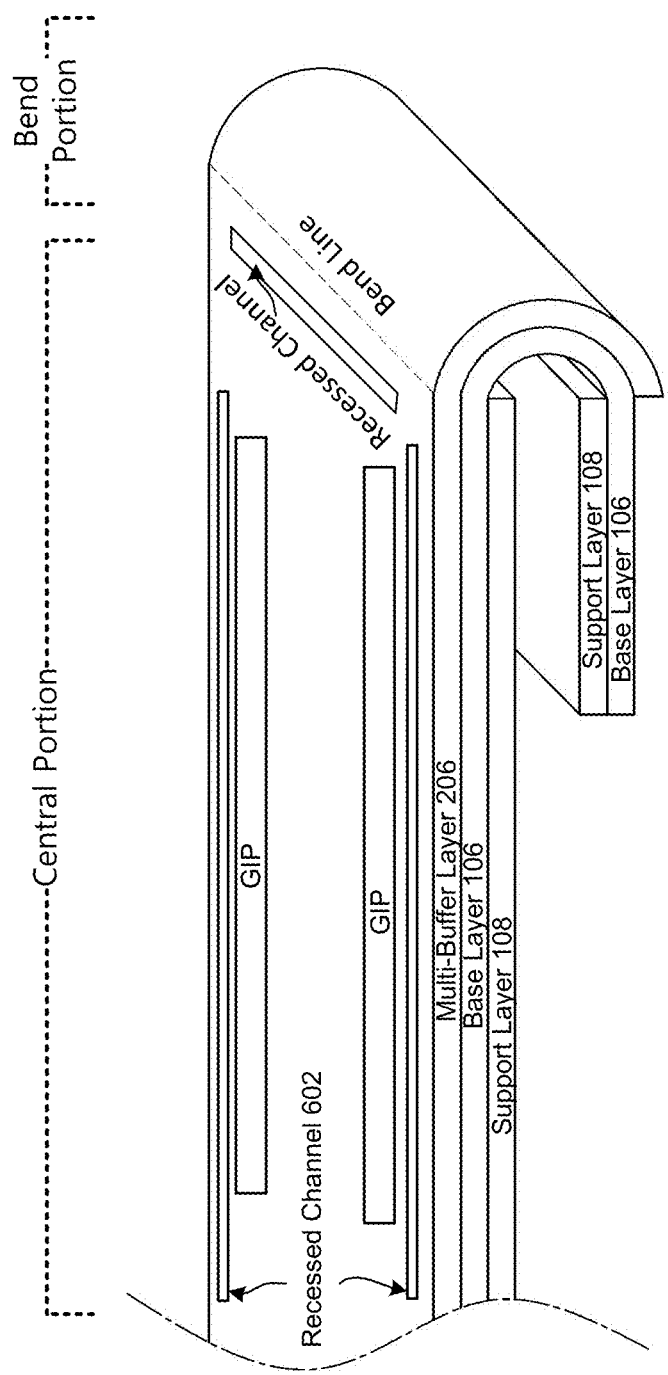
FIGS. 6A-6B illustrate schematic view of an exemplary configuration of recessed channel and crack deflection metal/insulation trace according to embodiments of the present disclosure.

Crack can also occur in the insulation layers during scribing and/or chamfering some part of the flexible display 100. The cracks generated at the edge of the flexible display 100 during such manufacturing processes can propagate towards central portion of the flexible display 100. In some cases, cracks at the edge of the side inactive areas propagate towards the active area and damage GIPs in the inactive areas. Accordingly, in some embodiments, a recessed channel can be formed in the inactive area by etching the insulation layers to a desired depth as shown in FIG. 6A. Etching of the insulation layers can be done near the boundary of central portion and the bend portion. More particularly, near the start of the bend allowance section. If desired, the recessed channel can be formed near the end of the bend allowance section. It should be noted that the recessed channel needs not be exactly at the bend line where the bend allowance section begins, but it can be positioned towards the central portion or inside the bend allowance section. In some embodiments, the recessed channel can be formed in the side inactive area between the GIP and outer edge of the inactive area. This way, propagation of cracks towards the GIP can be suppressed by the recessed channel by the recessed channel.

Figure 6B:
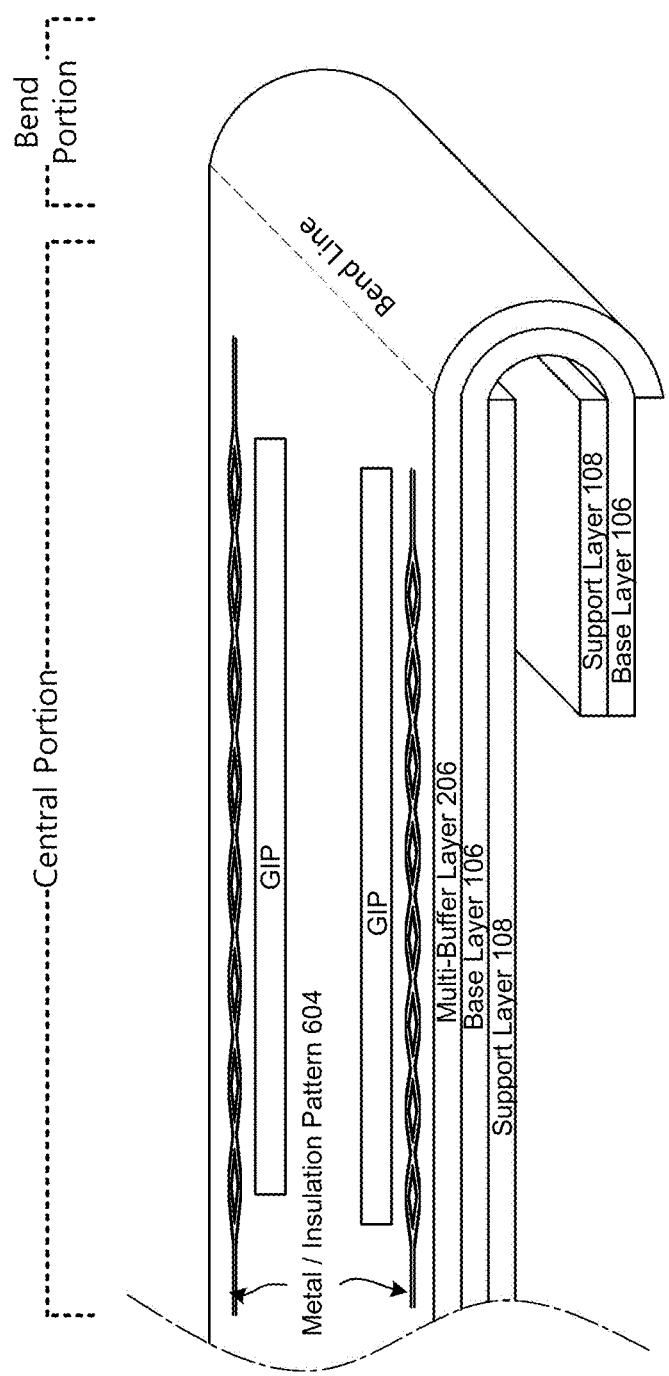

In some embodiments, a metal and insulation layer pattern capable of changing the direction of crack can be formed between a circuit positioned in the inactive area and the outer edge of the inactive area. For example, a diamond shaped metal trace and insulation layer covering the metal trace can be formed between the GIP and the outer edge of the flexible display 100 as depicted in FIG. 6B. In this configuration, the cracks propagating from the outer edge of the inactive area in the direction towards the GIP would change its course due to the angle of the diamond metal/insulation trace formed before the GIP.

However, complete removal of inorganic insulation layers, such as SiNx, can affect the electrical characteristic of components in the flexible display 100. For instance, undesired shift in the threshold voltage of TFTs was observed when SiNx layers were removed from the buffer layer 126. As such, in some embodiments, an additional metal layer is formed under the semiconductor layer of the TFTs, and the metal layer was electrically connected to the source electrode or gate electrode to maintain reliable operability of the TFT.

A trace designs plays an important role in reducing the bending stress in both the conductive line trace 120 and the insulation layers. For convenience of explanation, the conductive line trace 120 and the trace of insulation layer (i.e., passivation layer 128) covering at least some part of the conductive line trace 120 are collectively referred to as the "wire trace" in the following description.

The trace design should be determined by considering the electrical requirements of the conductive line trace 120 as well as the type of signals transmitted on the conductive line trace 120. Also, the properties of the materials (e.g., Young's modulus) used in forming the conductive line trace 120 and the insulation layers can be considered in designing the traces. It should be noted that various other factors such as a thickness, a width, a length, a layout angle for a section as well as for the entirety of the conductive line trace 120 and the insulation layers may need to be considered to provide a trace design having sufficient electrical and mechanical reliability for use in the flexible display 100.

The wire trace design may be specifically tailored for the conductive line trace 120 and the insulation layers based on their placement and orientation in reference to the bending direction (i.e., tangent vector of the curve) of the flexible display 100. A wire trace will be subjected to more bending stress as the direction in which the wire trace extends is more aligned to the tangent vector of the curvature. In other words, a wire trace will withstand better against the bending stress when the length of the wire trace aligned to the tangent vector of the curvature is reduced.

Figure 7:
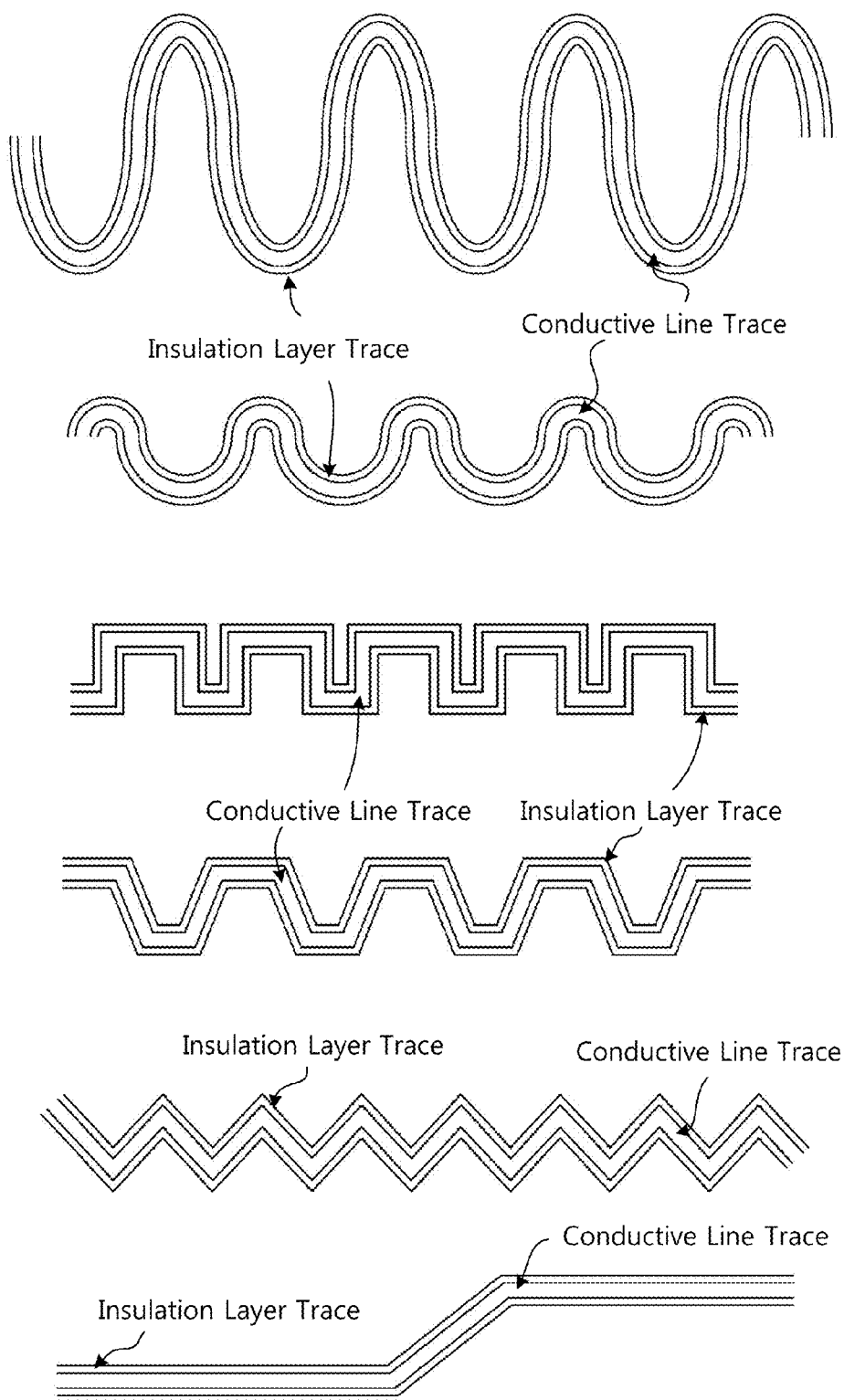
FIG. 7 is a schematic view of single line wire trace design usable for flexible displays according to an embodiment of the present disclosure.

In order to reduce the length of the wire trace portion being aligned to the tangent vector of the curvature, wire traces of the flexible display 100 may employ any one or more of a sign-wave, a square-wave, a serpentine, a saw-toothed and a slanted line trace designs illustrated in FIG. 7. In such configurations, the bending stress may be distributed to the trace portions oriented in an angle shifted away from the tangent vector of the curvature. The strain reducing trace designs illustrated in FIG. 7 are merely exemplary and should not be construed as limitations to the trace designs that can be used in the embodiments of the flexible display 100.

Some conductive line trace 120 may adopt different strain reducing trace designs from other conductive line trace 120 of the flexible display 100. In some embodiments, the conductive line trace 120 can have varying dimensions to facilitate tight spacing between the conductive lines. For instance, a convex side of a first wire trace may be placed in a concave side of a second wire trace next to the first wire trace.

Figure 8A:
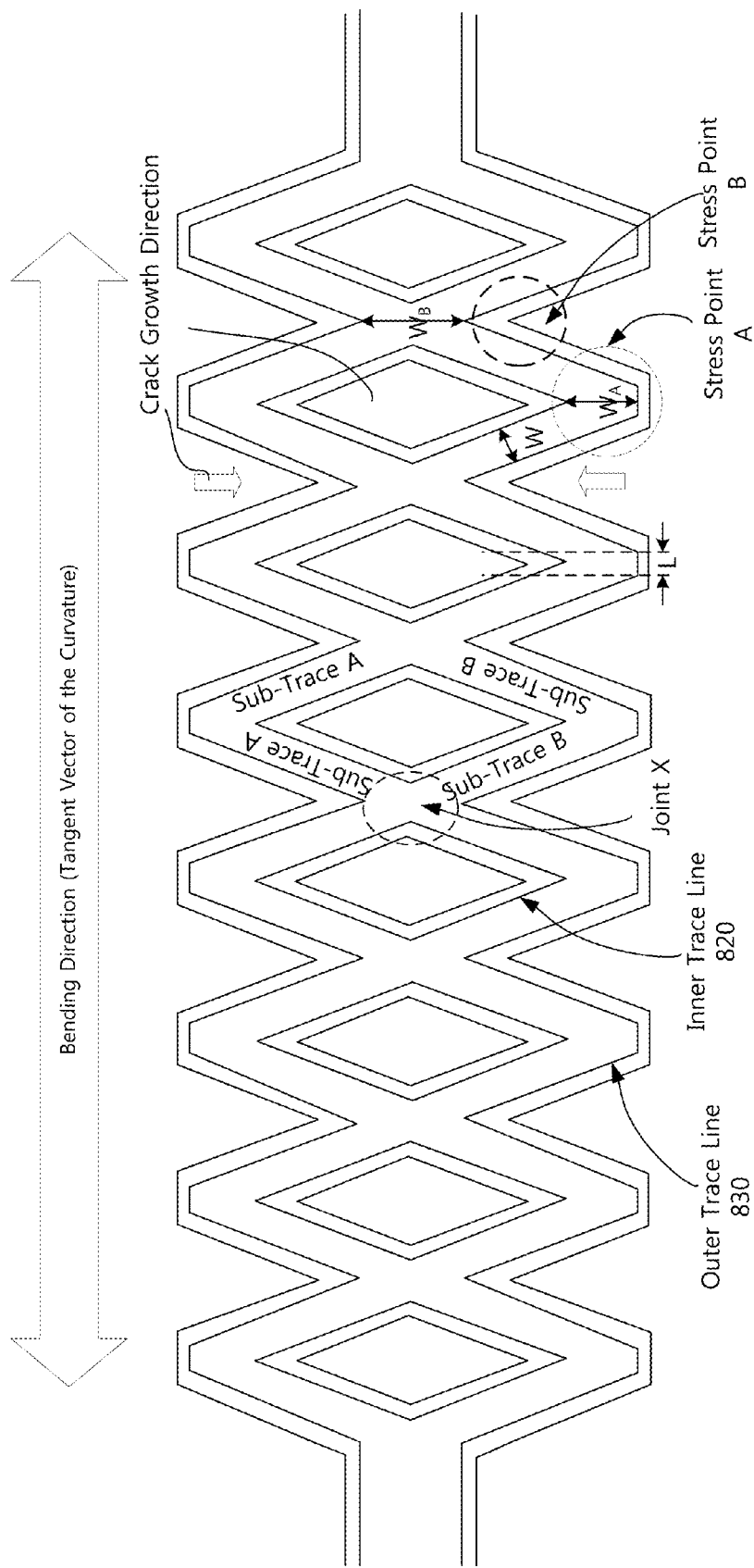
FIGS. 8A-8D illustrate schematic view of an exemplary wire traces having a plurality of sub-traces that split and merge at a certain interval according to embodiments of the present disclosure.

Since the cracks generally initiate from the insulation layer, it is imperative that the length of the insulation trace being aligned with the tangent vector of the curvature is minimized. In order to prevent or minimize severance of interconnections by cracks in the conductive line trace 120, the wire trace may split into multiple sub-traces, which and converge back into a single trace at a certain interval. In the example of FIG. 8A, a single trace of a conductive line trace 120 includes sub-trace A and sub-trace B, which merge back at every joint X, resembling a chain of diamonds. This trace design may be referred hereinafter as the diamond trace design 800. Because sub-traces are arranged to extend in the vector angled away from the tangent vector of the curvature, reduction in the length of the wire trace being aligned with the tangent vector of the curvature was realized in the similar manner as the trace designs illustrated in FIG. 7.

The diamond trace design 800 provides significant electrical advantage over the single line wire trace designs of the FIG. 7. First, given the same width, thickness and the angle shifting away from the tangent vector of the curve, nearly the half of electrical resistance was observed from the wire trace employing the diamond trace design in comparison to the wire trace employing the mountain trace design (i.e., 4.4Ω:8.6Ω). In addition, splitting of the trace into multiple sub-traces may provide a backup electrical pathway in case one of the sub-traces is damaged by cracks. As such, the diamond trace design can be used for the wire traces in the bend portion, and may be particularly helpful for the wire traces within the bend allowance section subjected to severe bending stress.

As mentioned, the distribution of the bending stress depends on the vector (i.e., split angle) of the sub-traces in reference to the bending direction. The sub-trace having a larger split angle away from the bending direction (i.e., tangent vector of the curvature) will be subjected to less bending stress. However, it should be noted that the split of the wire trace into multiple sub-traces does not by itself provide bend stress reduction on each sub-trace any more than the bend stress reduction realized by the wire trace oriented in the vector angle away from the tangent vector of the curvature. In fact, given the same conductive line width and angle of deviation from the tangent vector of the curvature, the result of bend stress simulation in a mountain shaped wire trace, which almost mirrors the shape of the one of the sub-traces in the diamond trace design, was nearly identical to the result of bend stress simulation exhibited on each sub-trace of the diamond trace design 800.

However, one of the extra benefits realized from the diamond trace design 800 is that the design allows to minimize or to eliminate the length of insulation layer trace being aligned (i.e., running parallel) to the tangent vector of the curvature with relatively little increase in the electrical resistance. As a result, significantly lower crack initiation rate can be obtained.

Reduction of the insulation layer trace aligned to the tangent vector of the curvature can be done by reducing the width of the conductive line trace 120 and the insulation layer covering the conductive line trace 120. When the insulation layer trace aligned to the tangent vector of the curve is eliminated by reduction of conductive line width and the insulation trace width, the average size of cracks was reduced from 3.79 µm to 2.69 µm. The ohmic contact resistance was increased to 4.51Ω from 3.15Ω, but such an increase has minimal effect in the operation of the flexible display 100.

The amount of reduction in the width of conductive line trace 120 is limited with the single line trace designs depicted in FIG. 7 as the electrical resistance of the conductive line trace 120 can become too high to be used for the flexible display 100. However, the additional electrical pathway created by splitting and merging of the conductive line trace 120 yields much lower electrical resistance in the conductive line trace 120 as compared to using the non-split strain reducing trace designs.

It should be noted that the splitting angle of the sub-traces affects the distance between the two adjacent joints X in the diamond trace design 800. The distance between the joints X need not be uniform throughout the entire wire trace. The intervals at which the trace splits and merges can vary within a single trace of wire based on the level of bending stress exerted on the parts of the wire trace. The distance between the joints X may be progressively shortened down for the parts of the wire trace towards the area of the flexible display 100 subjected to higher bending stress (e.g., area having lower radius of curvature, area having larger bend angle). Conversely, the distances between the joints X can progressively widen out towards the area subjected to lower bending stress.

Figure 8B:
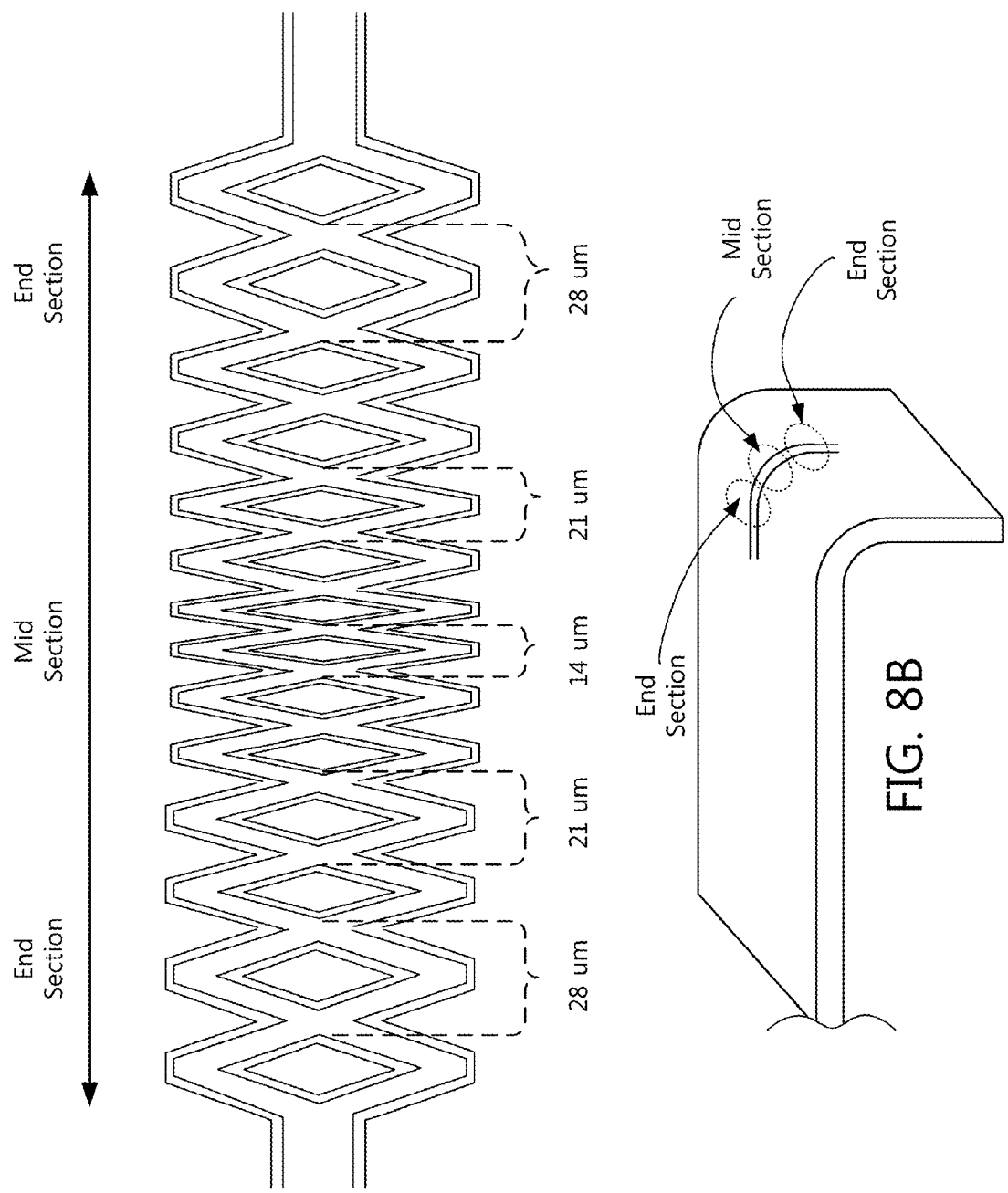

In an exemplary trace design of FIG. 8B, the distance between the joints X of a trace in the end sections is at a first distance (e.g., 27 um), but the distance becomes progressively shorter towards the mid-section of the trace. In the mid-section, the distance between the joints X is reduced by half. The end sections of the trace shown in FIG. 8B may be for the part of the wire trace near the beginning of a bend allowance section, and the mid-section of the trace may be for the part positioned at or near the middle of the bend allowance section of the flexible display 100.

A lower chance of crack initiation is afforded in the wire trace by selectively increasing the angle of sub-traces in the wire trace at high bending stress regions. With sub-traces that split and merge at a greater angle away from the bending direction, more thorough reduction in the lengths of the conductive line trace 120 and the insulation layer extending along the tangent vector of the curvature. This way, unnecessary increase in the electrical resistance can be avoided.

Figure 8C:
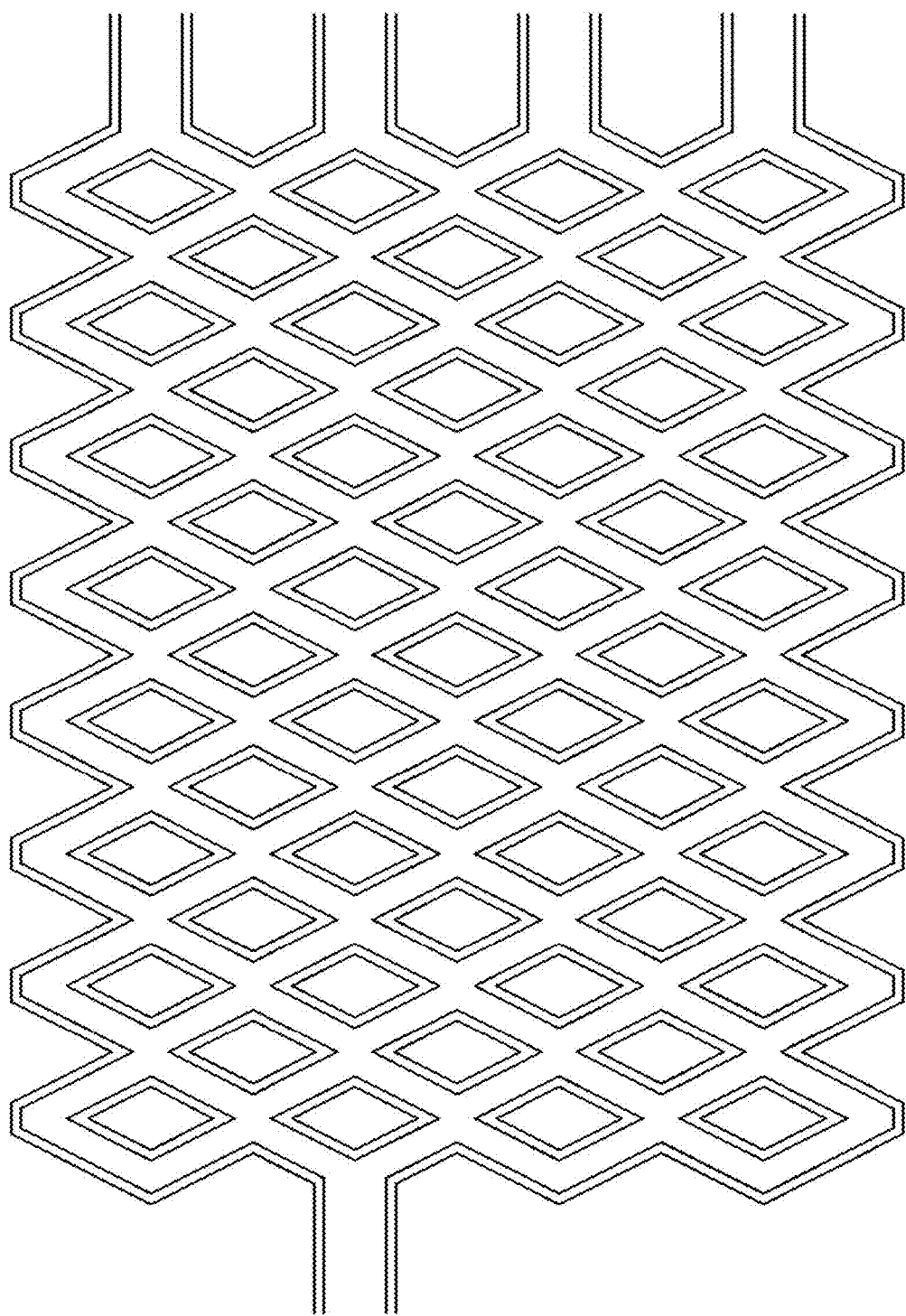

The wire trace may split into additional number of sub-traces, creating a grid-like wire trace in the bending area of the flexible display 100 as illustrated in FIG. 8C. As an example, the sub-traces can be configured to form a plurality of a web formed of diamond trace shapes. Such trace design may be useful for wire traces that transmit a common signal, for example VSS and VDD. Neither the number of sub-traces nor the shape of the sub-traces forming the grid-like trace design are particularly limited as the example shown in FIG. 8C. In some embodiments, the sub-traces may converge into a single trace past the bend allowance section of the flexible display 100.

The strain reducing trace designs discussed above may be used for all or parts of the conductive line trace 120. In some embodiments, the part of conductive line trace 120 in the bend portion of the flexible display 100 may adopt such a strain reducing trace design. The parts of a conductive line trace 120 prior to or beyond the part with the strain reducing trace design may have the same trace design. If desired, the strain reducing trace designs may be applied to multiple parts of a conductive line trace 120.

Even with the strain reducing trace design, the inevitable bending stress remains at certain points of the trace (i.e., stress point). The location of stress point is largely dependent on the shape of the trace as well as the bending direction. It follows that, for a given bending direction, the trace of a wire and/or an insulation layer can be designed such that the remaining bending stress would concentrate at the desired parts of their trace. Accordingly, a crack resistance area can be provided in a trace design to reinforce the part of the wire trace where the bend stress concentrates.

Referring back to FIG. 8A, when a wire trace having the diamond trace design is bent in the bending direction, the bending stress tends to focus at the angled corners, which are denoted as the stress point A and stress point B. When a crack forms at those angled corners, it generally grows in the transverse direction that to the bending direction. For instance, at the stress points A, a crack may initiate from the outer trace line 820 and grows towards the inner trace line 830. Similarly, a crack may initiate from the outer trace line 830 and grow towards the inner trace line 820 at the stress points B.

Accordingly, the width of the conductive line trace 120 at the stress points A can be selectively increase in transversal direction to the bending direction, thereby serving as a crack resistance area. That is, the widths (WA, WB) of the conductive line trace 120 at the stress points A and B, which are measured in the crack growth direction, may be longer than the width (W) of the conductive line trace 120 at other parts as depicted in FIG. 8A. The extra width in the crack growth direction at the stress points makes the conductive line trace 120 to hold out longer before a complete disconnection occurs.

In a testing, the wires had the three-layered structure (MO 200 Å/AL 3000 Å/MO 200 Å), which were formed on a 17 um thick PI base layer 106. A 1000 Å thick SiNx layer was formed between the base layer 106 and the multi-layered conductive line trace 120. Also, a layer of $SiO_2$ was formed over the multi-layered conductive line trace 120. The thickest portion of the $SiO_2$ on the conductive line trace 120 was 3000 Å. Each of the conductive lines 1 through 4 had different width a width of 8.5 um, 2.5 um, 3.5 um and 4.5 um, respectively, at the stress points A.

For each wire trace, electrical resistance was measured initially upon the bending and again at 15 hours later. If a crack is generated in the conductive line trace 120, the resistance of the conductive line trace 120 will be increased as well. The wire trace 1 with the longest width at the stress points A exhibited the lowest mean increase resistance rate whereas the wire 2 with the shortest width at the stress points A exhibited the largest mean increase resistance rate. Also, a complete severance was observed in three samples of the wire trace 2 and two samples of the wire trace 3. While complete severance in the wire trace 4, a considerable increase in the resistance was observed after 15 hours. Accordingly, a sufficient width at the stress points A is needed to maintain the reliability of the wire.

For instance, the width of the wire at the stress points A may be longer than 4.0 um. The width of the wire measured in the direction of the crack growth direction may be longer than 5.0 um for further improvement in the reliability. Even with the increased width of the conductive line trace 120 in the transversal direction to the bending direction, the length for the continuous portion of the insulation layer being aligned to the bending direction should be kept minimal. Accordingly, in an embodiment, the width of the wire at the stress points A ranges from about 2.5 um to about 8 um, more preferably, from about 3.5 um to about 6 um, more preferably from about 4.5 um to about 8.5 um, and more preferably at about 4.0 um.

The width of the conductive line trace 120 measured in the crack growth direction at the stress points B should also be maintained in the similar manner as the width of the conductive line trace 120 at the stress points A. As such, the width of the wire at the stress points B may ranges from about 2.5 um to about 8 um, more preferably, from about 3.5 um to about 6 um, more preferably from about 4.5 um to about 8.5 um, and more preferably at about 4.0 um. Due to the close proximity of the angled corners and their crack growth direction at the stress points B, the width of the conductive line trace 120 at the stress points B may be longer than width at the stress points A.

In order to minimize the chance of crack initiating from both the inner trace line 820 and the outer trace line 830, at least one of the trace lines be not as sharply angled as the other trace lines at the stress points A. In the embodiment depicted in FIG. 8A, the inner trace line 820 at the stress points A has the angled corner and the outer trace line 830 at the stress points A is substantially parallel (e.g., ±5°) to the bending direction. However, the length L of the outer trace line 830 extending in the bending direction in excess may defeat the purpose of utilizing the strain reducing trace design in the first place. As such, the length L for the portion of the outer trace line 830 extending substantially parallel to the bending direction may be equal to or deviate slightly (e.g., within ±2.5 μm) from the width W of the wire trace. Alternatively, the sharply angled corner can be formed with the outer trace line 830 while the inner trace line 820 at the stress points A being substantially parallel to the bending direction. In both cases, the less sharply angled trace line can simply be more rounded rather than having the straight line trace as shown in FIG. 8A.

As discussed above, splitting and merging of the wire creates stress points that share the given amount of bending stress. With the relatively low bending stress at each stress point, there is less chance of crack initiation. In some cases, however, available space on the flexible display 100 may limit the number of joints X of a trace. That is, excess joints X in a wire trace may take up too much space in the flexible display 100. On the other hand, the limited number of joints X in a trace may not be enough to prevent or minimize crack initiating at the stress points.

Accordingly, in some embodiments, a trace may be provided with a number of micro-stress points 810 that are strategically positioned along one or more sub-traces such that the bending stress on the sub-trace is distributed among the micro-stress points 810. In the example depicted in FIG. 8D, the insulation trace includes a number of micro-stress points 810. As discussed, the angled corners tend to be the stress points in a trace design. Thus a plurality of angled cutouts can be formed along the insulation layer trace to serve as a micro stress points 810. In this setting, at least some fraction of the bending stress on each of the sub-traces would be focused on each of the micro-stress points 810. With each micro-stress points 810 taking up the fraction of the given bending stress on the sub-traces, the size of the crack at each micro-stress points 810 may be smaller than a crack size that would result in the insulation layer trace without the micro-stress points 810. Accordingly, this can reduce the chance of complete severance of the conductive line trace 120.

Figure 8D:
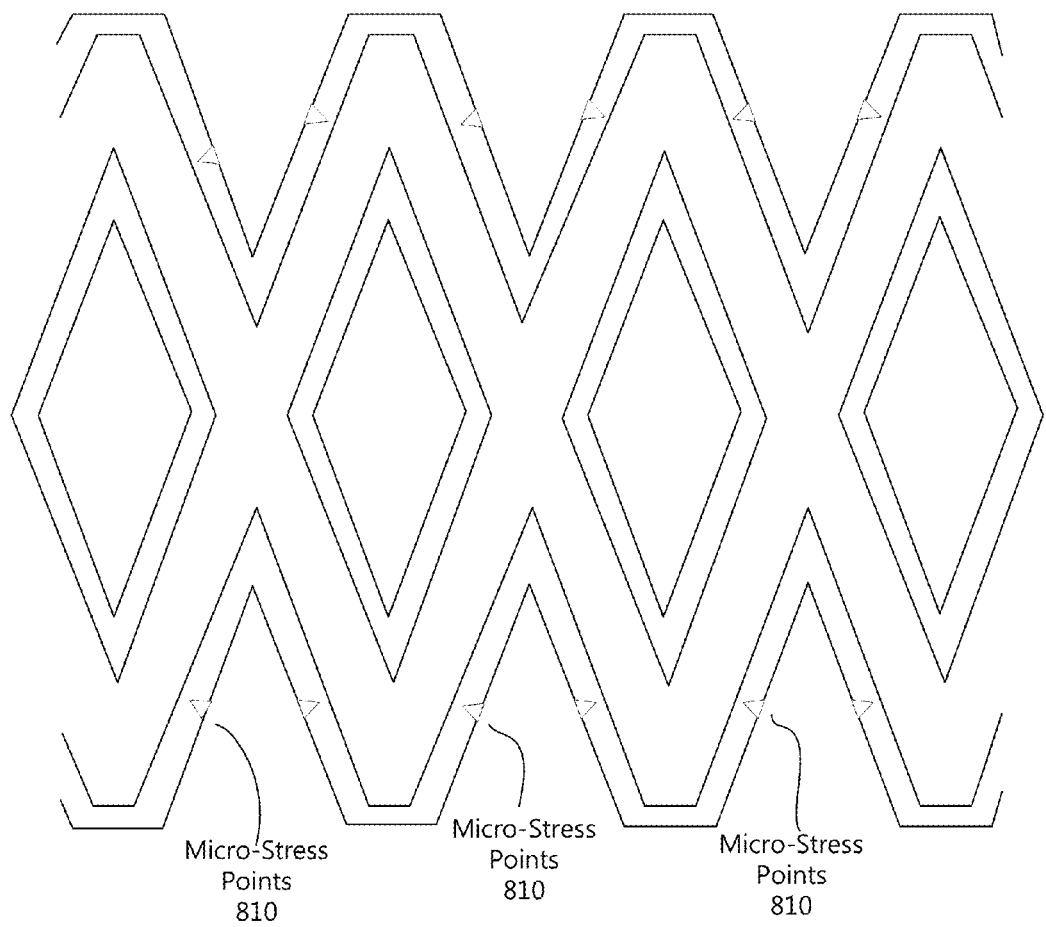

It should be appreciated that the location and the number of micro-stress points 810 is not limited as shown in FIG. 8D. Additional micro-stress points 810 can be formed at the desired location in the respective insulation traces to further reduce the chance of crack initiation.

As discussed above, some structural elements may not exist in some areas of the flexible display 100 to facilitate bending. For example, elements such as the touch sensor layer 112, polarizer layer 110 and the like may be absent in the bend area of the flexible display 100. Also, some of the insulation layers, for instance a multi-buffer layer 118, may be simplified in some degree so that the insulation layer has less number of sub-layers or has a decreased thickness at one area as compared to other areas in the flexible display 100. Absence or simplification of these components and the layers would create a recessed area where the wire trace and/or the insulation layer trace need to cross.

The amount of bending stress and the direction in which the bending stress is exerted on the wire trace laid over the recessed area may differ from the bending stress exerted to other parts of bend portion. To accommodate the difference, the strain reducing trace design for the wire traces at the recessed area can also differ from the strain reducing trace design used elsewhere.

Figure 9A:
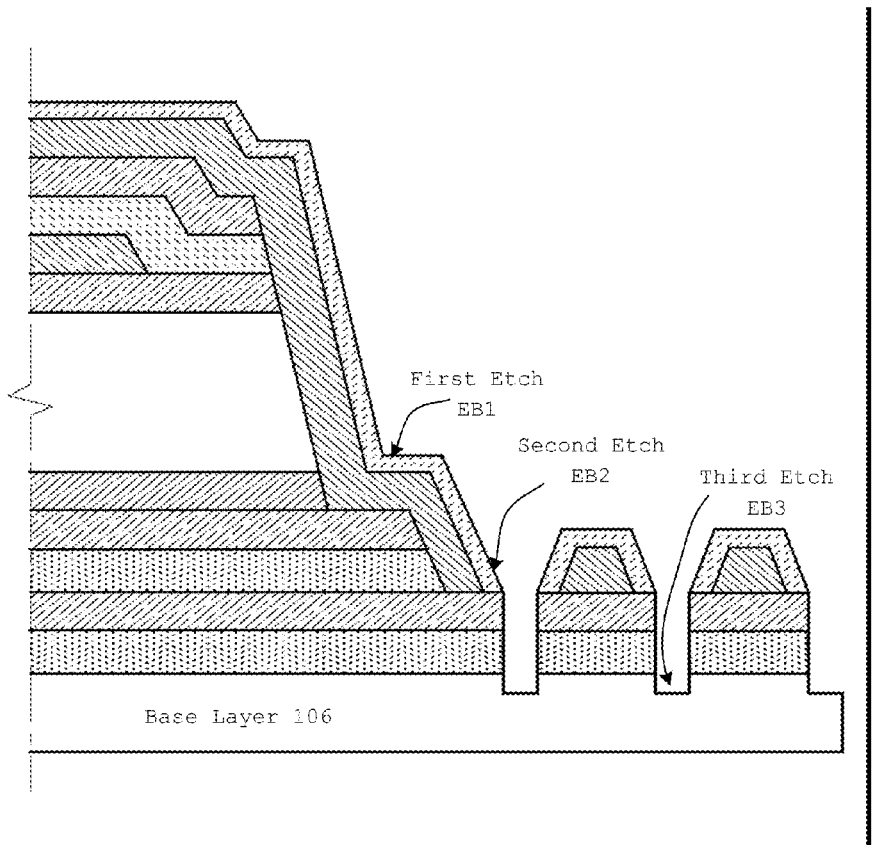
FIGS. 9A-9B illustrate schematic view of an exemplary wire traces crossing recessed area of the flexible display according to embodiments of the present disclosure.

FIG. 9A illustrates a cross-sectional view at an edge of a backplane for in the exemplary flexible display 100, in which several insulation layers are removed from the bending portion to facilitate more reliable bending.

As shown, there are several organic and inorganic layers formed in between the base layer 106 and the OLED element layer 102. In this particular example, alternating stacks of SiNx and SiO2 layers can be disposed on the base layer 106 to serve as a buffer layer. The semiconductor layer of a TFT may be sandwiched by an active-buffer layer and a gate insulation layer that are formed of SiO2 layer. The gate of the TFT is disposed on an interlayer dielectric layer (ILD), and the source/drain of the TFT having the multi-layered structure as discussed above is sandwiched between the ILD and a passivation layer. Here, the ILD may be formed of a stack of SiNx and SiO2, and the passivation layer is formed of SiNx. Then, a planarization layer is disposed over the passivation layer so that the anode for the OLED can be disposed thereon.

It should be noted that the use of the strain reducing trace design is not just limited to the part of the wires within the bend portion. In other words, the strain reducing trace design can start and end in the area outside the bend portion. Using the strain reducing trace design for the wire trace in such abridging area can afford increased protection to the wire trace against the bending stress.

In the abridging area, however, several layers between the base layer 106 and the OLED element layer 102 are absent to facilitate bending of the flexible display 100. For instance, the ILD and the gate insulation layer are etched away in the trimmed area by the first etch process, which is followed by the second etch process that etches away the active buffer and a part of the buffer 126 (e.g., a stack of a SiNx layer and a SiO2 layer). These etching processes create multiple steps where a sharp change of direction occurs between the wire trace disposed on the vertically sloped surfaces and the wire trace disposed on the horizontally leveled surfaces. In other words, the wire trace would have several bent spots, such as EB1 and EB2.

When bending the flexible display 100 in the bending direction, the wire trace may experience more strain at or near the steps. Numerous tests and experiments indicate that the chance of a crack is especially high in the wire trace crossing over the step between the EB1 area and the EB2 area. Accordingly, in some embodiments, the strain reduction trace design for the wire trace has a reinforced portion at or near the step between a high leveled surface and a low leveled surface provided by insulation layers of the flexible display.

Figure 9B:
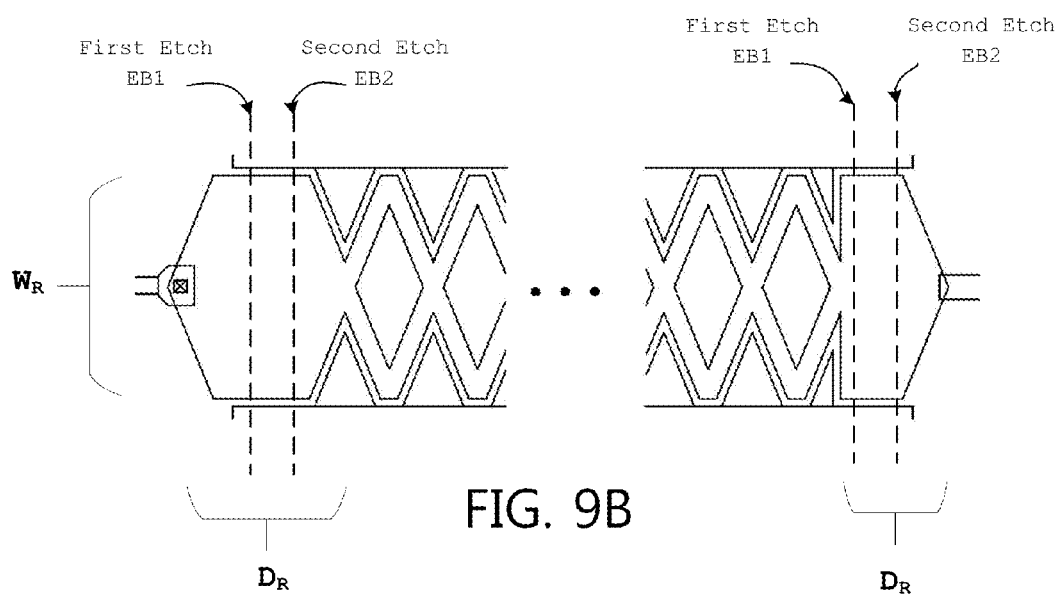

In the example shown in FIG. 9B, the wire trace has a simple straight line trace design in the beginning, which is changed into the split and merge strain reduction trace design in the abridged area. In addition, the part of the conductive line that crosses over before and after the bent spots EB1 and EB2 is reinforced with extra width WR. That is, the conductive line has substantially wider width to reinforce the conductive line trace 120 near the bent spots EB1 and EB2 to ensure the perseveration of the conductive line trace 120 even if cracks initiate from the insulation layer covering the reinforced portion of the conductive line. The distance DR of the reinforced portion of which the conductive line is reinforced with the wider increased width WR depends on the size of the steps created by the etching processes as well as the distance between the bent spots EB1 and EB2. Past the reinforced part, the wire trace continues with the diamond trace design discussed above. The strain reduction trace design for the wire trace that comes before and after the reinforced portion is not particularly limited to the trace design as depicted in FIG. 9B, and any other strain reduction trace design discussed above may be used.

While this may not always be the case, the abridged area would likely be located slightly towards the central portion of the flexible display 100 before the bend allowance section as it will help the most in bending of the flexible display 100. In such cases, the bent spots EB1 and EB2 would be positioned at of just outside start of the bend allowance section in the bend portion.

The increased width WR of the reinforced conductive line trace 120 portion may serve its purpose well at or near the beginning of the bend allowance section where the curvature is relatively small. However, the wider width WR of the wire trace would increase the length of the wire trace that is linear to the bending direction. This would be make the wire trace harder to hold out against the bending stress at the region with greater bend radius. For this reason, the distance DR in which the reinforced portion is used should be limited such that the reinforced conductive line portion does not extend too far beyond towards into the bend allowance section. In other words, the distance DR of the reinforced conductive line portion may be limited such that the trace design of the reinforced conductive line portion does not extend beyond the bend allowance section with more than a threshold bend angle. In way of an example, the reinforced conductive line portion may not extend beyond the point where it is 30° curved away from the tangent plane of the curvature. The threshold bend angle may be less than 20°, for example 10°, and more preferably less than 7°.

The wire trace having the reinforced section may extend beyond the bend allowance area and reach into the secondary active area. In such instances, there may be additional bent spots (similar to EB1 and EB2) at or near the end of the bend allowance section. The conductive line at or near such bent spots may be reinforced in the similar manner as the wire trace portion at the bent spots EB1 and EB2. If desired, the reinforced conductive line portion at or near the bent spots at the other end of the bend allowance section may be different as depicted in FIG. 9B.

Although the concepts and teachings in the present disclosure are described above with reference to OLED display technology, it should be understood that several features may be extensible to any form of flexible display technology, such as electrophoretic, liquid crystal, electrochromic, displays comprising discreet inorganic LED emitters on flexible substrates, electrofluidic, and electrokinetic displays, as well as any other suitable form of display technology.

As described above, a flexible display 100 may include a plurality of innovations configured to allow bending of a portion or portions to reduce apparent border size and/or utilize the side surface of an assembled flexible display 100. In some embodiments, bending may be performed only in the bend portion and/or the bend allowance section having only the conductive line trace 120 rather than active display components or peripheral circuits. In some embodiments, the base layer 106 and/or other layers and substrates to be bent may be heated to promote bending without breakage, then cooled after the bending. In some embodiments, metals such as stainless steel with a passive dielectric layer may be used as the base layer 106 rather than the polymer materials discussed above. Optical markers may be used in several identification and aligning process steps to ensure appropriate bends absent breakage of sensitive components. Components of the flexible display 100 may be actively monitored during device assembly and bending operations to monitor damage to components and interconnections.

Constituent materials of conductive line trace 120 and/or insulation layers may be optimized to promote stretching and/or compressing rather than breaking within a bending area. Thickness of a conductive line trace 120 may be varied across a bending area and/or the bend allowance section to minimize stresses about the bend portion or the bend allowance section of the flexible display 100. Trace design of conductive line trace 120 and insulation layers may be angled away from the bending direction (i.e., tangent vector of the curvature), meandering, waving, or otherwise arranged to reduce possibility of severance during bending. The thickness of the conductive line trace 120, insulation layers and other components may be altered or optimized in the bend portion of the flexible display 100 to reduce breakage during bending. Bend stresses may be reduced by adding protective micro-coating layer(s) over components in addition to disclosed encapsulation layers. Conductive films may be applied to the conductive line trace 120 before, during, or after bending in a repair process. Furthermore, the constituent material and/or the structure for conductive line trace 120 in a substantially flat area of a flexible display 100 may differ from the conductive line trace 120 in a bend portion and/or the bend allowance section.

These various aspects, embodiments, implementations or features of the described embodiments can be used separately or in any combination. The foregoing is merely illustrative of the principles of this invention and various modifications can be made by those skilled in the art without departing from the scope of the invention.

What is claimed is:

1. A flexible display, comprising:
    a base layer having a substantially flat portion and a bend portion that is curved away from a plane of the substantially flat portion;
    a plurality of insulation layers on the base layer, said plurality of insulation layers providing a high leveled surface and a low leveled surface such that a step is created between the high leveled surface and the low leveled surface;
    a conductive line trace laid over the high leveled surface and the low leveled surface, wherein the conductive line trace has a reinforced portion at the step; and
    a metal layer that is positioned under a first insulation layer providing the high leveled surface and a second insulation layer providing the low leveled surface,
    wherein a width of the reinforced portion is greater than a width of a portion of the conductive line trace adjacent to the reinforced portion, wherein at least some portion of the conductive line trace laid in the bend portion of the base layer has a bend stress relief trace design in which the conductive line trace splits and merges back at an interval, wherein the reinforced portion of the conductive line starts on the high leveled surface and ends on the low leveled surface, and wherein the step between the high leveled surface and the low leveled surface is provided within the substantially flat portion within an inactive area of the flexible display.

2. The flexible display of claim 1, wherein a length of the reinforced portion is greater than a length of an inclining/declining surface of step between the high leveled surface and the low leveled surface.

3. The flexible display of claim 1, further comprising a passivation layer covering the conductive line trace with a predetermined margin beyond an outline of the conductive line trace.

4. The flexible display of claim 2, wherein the high leveled surface is positioned above a semiconductor layer of a thin-film-transistor (TFT) and the low leveled surface is positioned below the semiconductor layer of the TFT, wherein the conductive line trace is connected to the semiconductor layer via a contact hole through the high leveled surface.

5. The flexible display of claim 2, wherein the high leveled surface and the low leveled surface are positioned below a semiconductor layer of a thin-film-transistor (TFT).

6. The flexible display of claim 4, wherein the first and second insulation layers are inorganic layers.

7. The flexible display of claim 1, wherein the TFT is a driving TFT having one of its electrodes connected to an anode of an organic light emitting diode (OLED).

8. The flexible display of claim 6, wherein the metal layer interposed between the first and second insulation layers is electrically connected to a source electrode of the TFT.

9. The flexible display of claim 6, wherein the metal layer interposed between the first and second insulation layers is electrically connected to a gate electrode of the TFT.

10. The flexible display of claim 2, wherein the bend portion is provided between said substantially flat portion and another substantially flat portion of the base layer having another high leveled surface provided therein which generates a second step.

11. The flexible display of claim 8, wherein the conductive line includes a second reinforced portion at the second step.

12. A flexible display, comprising:

a base layer having a substantially flat portion and a bend portion that is curved away from a plane of the substantially flat portion;

a plurality of insulation layers on the base layer, said plurality of insulation layers providing a high leveled surface and a low leveled surface such that a step is created between the high leveled surface and the low leveled surface;

a conductive line trace laid over the high leveled surface and the low leveled surface, wherein the conductive line trace has a reinforced portion at the step; and a metal layer that is positioned between a first insulation layer providing the high leveled surface and a second insulation layer providing the low leveled surface, wherein a width of the reinforced portion is greater than a width of a portion of the conductive line trace adjacent to the reinforced portion, wherein at least some portion of the conductive line trace laid in the bend portion of the base layer has a bend stress relief trace design in which the conductive line trace splits and merges back at an interval, wherein a length of the reinforced portion is greater than a length of an inclining/declining surface of step between the high leveled surface and the low leveled surface, wherein the high leveled surface is positioned above a semiconductor layer of a thin-film-transistor (TFT) and the low leveled surface is positioned below the semiconductor layer of the TFT, wherein the conductive line trace is connected to the semiconductor layer via a contact hole through the high leveled surface, and wherein the first and second insulation layers are inorganic layers.

13. The flexible display of claim 12, wherein the reinforced portion of the conductive line starts on the high leveled surface and ends on the low leveled surface.

14. The flexible display of claim 13, wherein the step between the high leveled surface and the low leveled surface is provided within the substantially flat portion within an inactive area of the flexible display.

15. The flexible display of claim 14, further comprising a metal layer that is positioned under a first insulation layer providing the high leveled surface and a second insulation layer providing the low leveled surface.

16. The flexible display of claim 12, wherein the metal layer is electrically connected to the conductive line trace.

17. The flexible display of claim 12, wherein the metal layer interposed between the first and second insulation layers is electrically connected to a source electrode of the TFT.

18. The flexible display of claim 12, wherein the metal layer interposed between the first and second insulation layers is electrically connected to a gate electrode of the TFT.

19. The flexible display of claim 12, wherein the bend portion is provided between said substantially flat portion and another substantially flat portion of the base layer having another high leveled surface provided therein which generates a second step.

20. The flexible display of claim 17, wherein the conductive line includes a second reinforced portion at the second step.

* * * * *